(12) United States Patent
Lee et al.

(10) Patent No.: US 10,535,533 B2
(45) Date of Patent: Jan. 14, 2020

(54) SEMICONDUCTOR DEVICE

(71) Applicant: Samsung Electronics Co., Ltd., Suwon-si, Gyeonggi-do (KR)

(72) Inventors: Yanghee Lee, Incheon (KR); Jonghyuk Park, Hwaseong-si (KR); Choongseob Shin, Uiwang-si (KR); Hyojin Oh, Seongnam-si (KR); Boun Yoon, Seoul (KR); Ilyoung Yoon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 15/868,544

(22) Filed: Jan. 11, 2018

(65) Prior Publication Data
US 2019/0019742 A1   Jan. 17, 2019

(30) Foreign Application Priority Data

Jul. 12, 2017 (KR) .................. 10-2017-0088655

(51) Int. Cl.
| | |
|---|---|
| *H01L 23/48* | (2006.01) |
| *H01L 27/108* | (2006.01) |
| *H01L 21/768* | (2006.01) |
| *H01L 25/065* | (2006.01) |
| *H01L 49/02* | (2006.01) |
| *H01L 21/48* | (2006.01) |

(52) U.S. Cl.
CPC ...... *H01L 21/481* (2013.01); *H01L 21/76898* (2013.01); *H01L 25/0657* (2013.01); *H01L 27/10808* (2013.01); *H01L 27/10852* (2013.01); *H01L 2225/06541* (2013.01)

(58) Field of Classification Search
CPC ............ H01L 23/481; H01L 27/10852; H01L 25/0657; H01L 27/10808; H01L 21/76898; H01L 2225/06541; H01L 27/10817; H01L 28/90; H01L 28/86
See application file for complete search history.

(56) References Cited

U.S. PATENT DOCUMENTS

| | | | |
|---|---|---|---|
| 7,436,014 B2 | 10/2008 | Son | |
| 7,501,668 B2 | 3/2009 | Jang et al. | |
| 8,927,426 B2 | 1/2015 | Lee et al. | |
| 8,975,729 B2 | 3/2015 | Ramachandran et al. | |
| 9,018,768 B2 | 4/2015 | Park et al. | |
| 9,240,330 B2 | 1/2016 | Takeda et al. | |
| 9,379,042 B2 | 6/2016 | Park et al. | |
| 9,559,002 B2 | 1/2017 | Lee et al. | |

(Continued)

FOREIGN PATENT DOCUMENTS

| | | |
|---|---|---|
| JP | 2005-243689 A | 9/2005 |
| KR | 2003-0058585 A | 7/2003 |

*Primary Examiner* — Steven H Loke
*Assistant Examiner* — Juanita B Rhodes
(74) *Attorney, Agent, or Firm* — Harness, Dickey and Pierce, P.L.C.

(57) ABSTRACT

A semiconductor may include a substrate including a cell array region and a TSV region, an insulation layer disposed on the substrate and having a recess region on the TSV region, a capacitor on the insulation layer of the cell array region, a dummy support pattern disposed on the insulation layer of the TSV region and overlapping the recess region, when viewed in plan, and a TSV electrode penetrating the dummy support pattern and the substrate.

20 Claims, 22 Drawing Sheets

(56) References Cited

U.S. PATENT DOCUMENTS

| | | |
|---|---|---|
| 2003/0094634 A1 | 5/2003 | Cho et al. |
| 2012/0313258 A1 | 12/2012 | Kitada et al. |
| 2013/0020719 A1 | 1/2013 | Jung et al. |
| 2015/0017779 A1* | 1/2015 | Kim .................. H01L 27/10852 438/381 |
| 2015/0102395 A1 | 4/2015 | Park et al. |
| 2015/0108605 A1* | 4/2015 | Park .................. H01L 27/10817 257/532 |
| 2015/0145124 A1* | 5/2015 | Kang .................. H01L 25/0652 257/737 |
| 2018/0158732 A1* | 6/2018 | Tseng .................... H01L 23/481 |

* cited by examiner

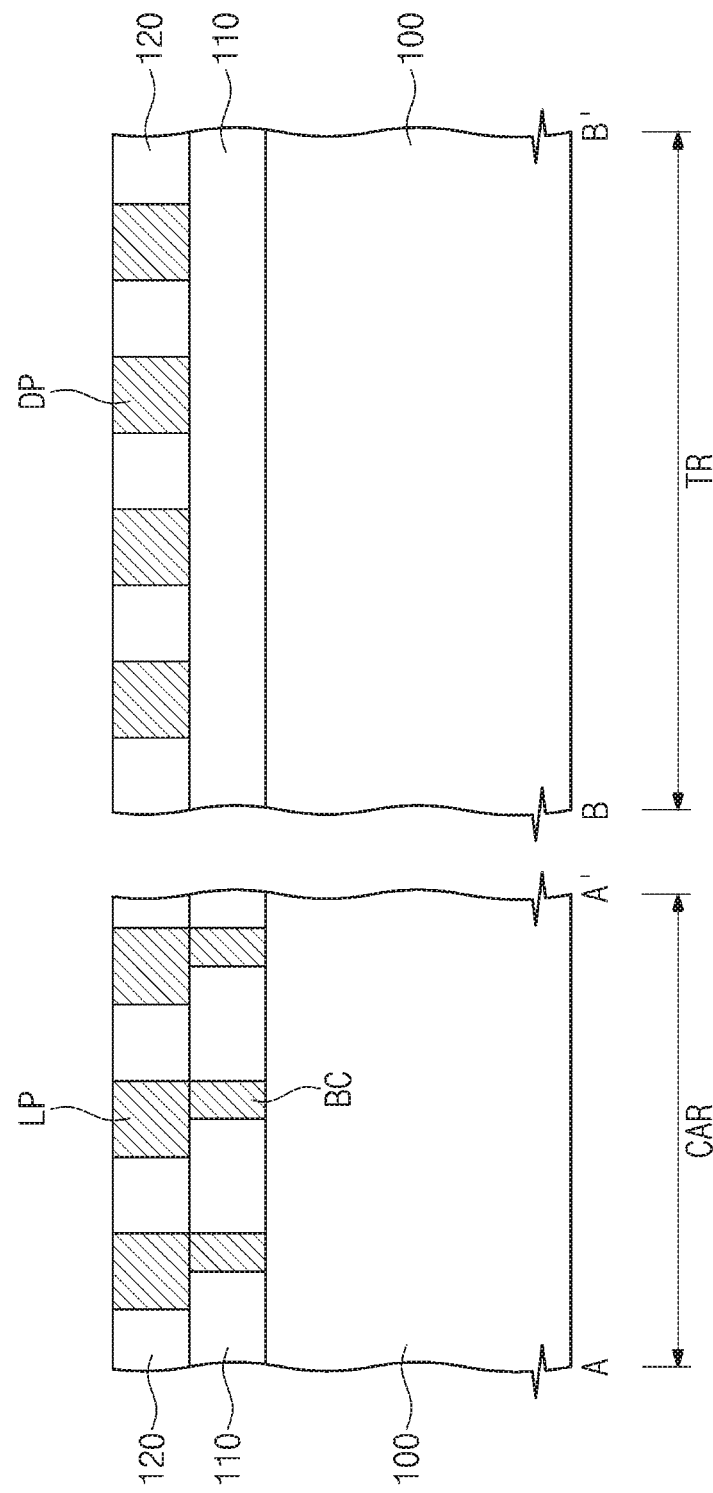

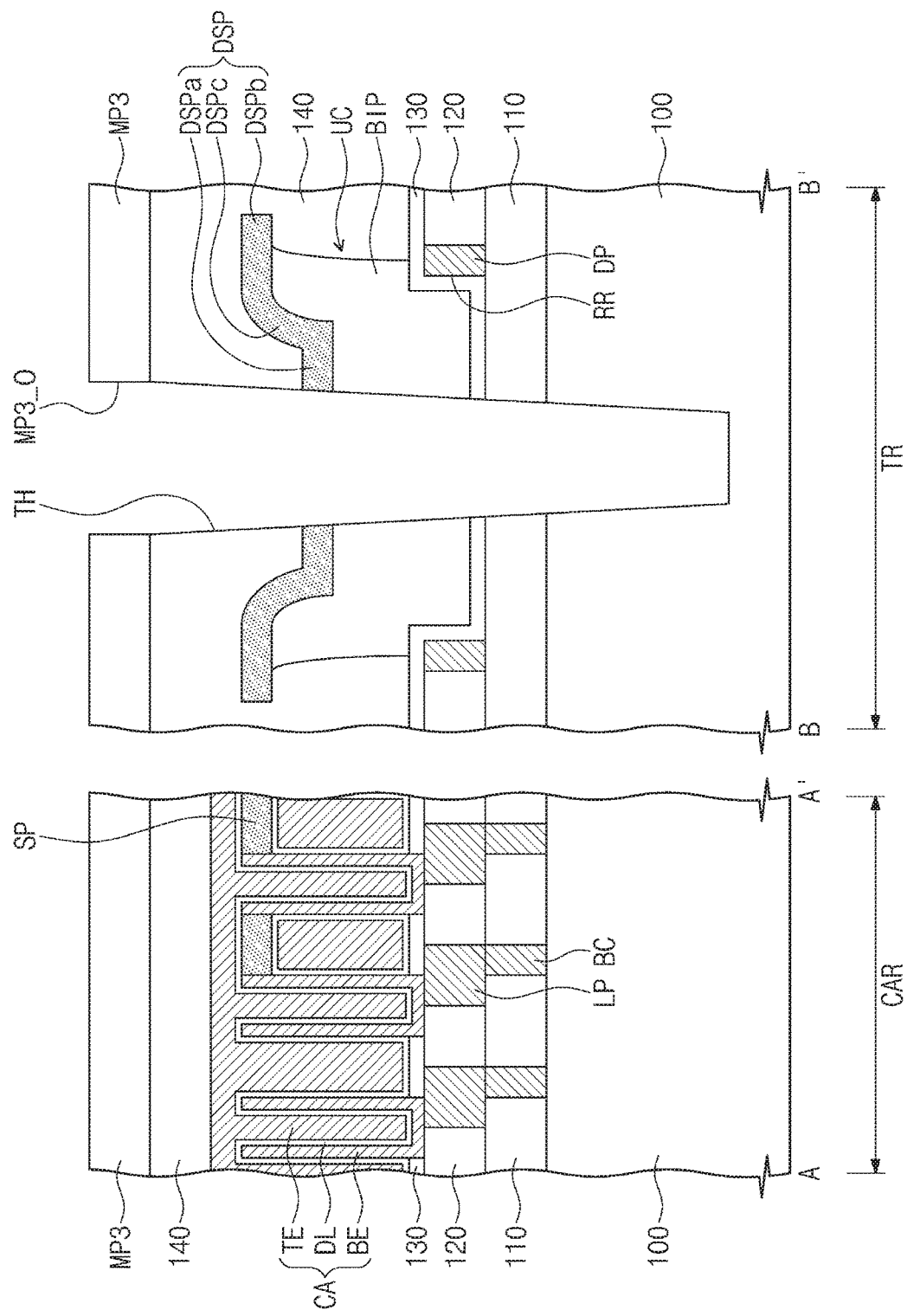

SEMICONDUCTOR DEVICE

CROSS-REFERENCE TO RELATED APPLICATIONS

This U.S. nonprovisional patent application claims priority under 35 U.S.C § 119 of Korean Patent Application No. 10-2017-0088655 filed on Jul. 12, 2017 entire contents of which are hereby incorporated by reference.

BACKGROUND

Example embodiments of the inventive concepts relate to a semiconductor device and/or a method of manufacturing the same. For example, at least some example embodiments relate to a semiconductor device including a through electrode and/or a method of manufacturing the same.

TSV (through-silicon-via) technology for forming an electrical connection vertically penetrating a substrate or die has been used in the development of three-dimensional (3D) packages in which a plurality of semiconductor chips are mounted in one semiconductor package. To improve performance and reliability of 3D packages, a device fabrication technique may be used to form TSV structures capable of providing stable operating characteristics and high reliability.

SUMMARY

Some example embodiments of the inventive concepts provide a semiconductor device having enhanced reliability.

Example embodiments of inventive concepts are not limited to the above-mentioned one, and other objects which have not been mentioned above will be clearly understood to those skilled in the art from the following description.

According to some example embodiments of the inventive concepts, a semiconductor device may include a substrate including a cell array region and a through-silicon-via (TSV) region; an insulation layer on the substrate within the cell array region and the TSV region, the insulation layer including a recess region within the TSV region; a capacitor on the insulation layer within the cell array region; a dummy support pattern on the insulation layer within the TSV region such that the dummy support pattern overlaps the recess region, when viewed in plan; and a TSV electrode penetrating the dummy support pattern and the substrate.

According to some example embodiments of the inventive concepts, a semiconductor device may include a substrate including a cell array region and a through-silicon-via (TSV) region; an insulation layer within the cell array region and the TSV region, the insulation layer including a recess region within the TSV region; a plurality of bottom electrodes on the insulation layer within the cell array region; a support pattern on sidewalls of the bottom electrodes; a dummy support pattern on the insulation layer within the TSV region such that the dummy support pattern overlaps the recess region, when viewed in plan; and a TSV electrode penetrating the dummy support pattern and the substrate.

According to some example embodiments of the inventive concepts, a semiconductor device may include a substrate including a cell array region and a through-silicon-via (TSV) region; an insulation layer on the substrate within the cell array region and the TSV region, the insulation layer including a plurality of recess regions within the TSV region; a capacitor on the insulation layer within the cell array region; a dummy support pattern on the insulation layer within the TSV region such that the dummy support pattern overlaps the plurality of recess regions, when viewed in plan; and a plurality of TSV electrodes penetrating the dummy support pattern and the substrate.

Details of some example embodiments are included in the description and drawings.

DETAILED DESCRIPTION

Figure 1:
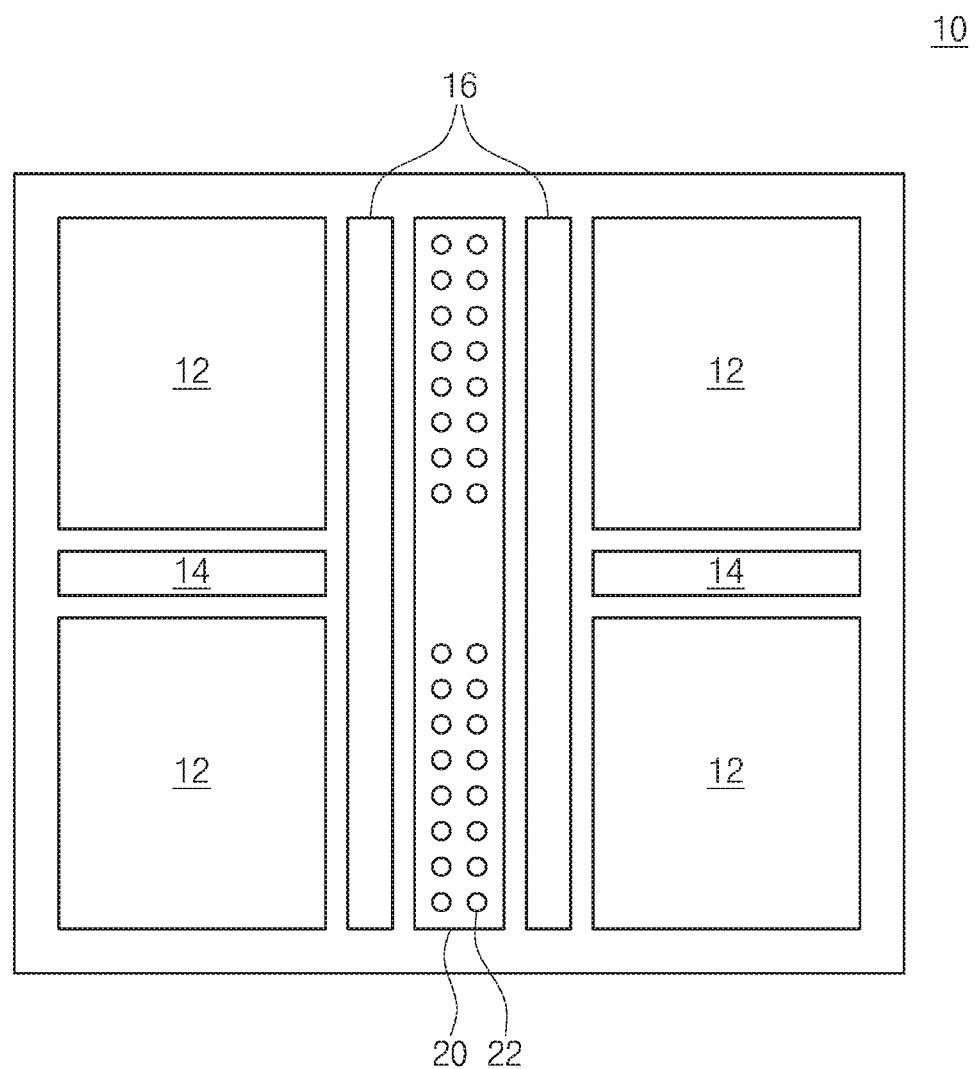
FIG. 1 illustrates a simplified plan view showing a semiconductor device according to some example embodiments of the inventive concepts.

It will be described hereinafter some example embodiments of the inventive concepts with reference to the accompanying drawings. Like reference numerals may indicate like components throughout the description.

FIG. 1 illustrates a simplified plan view showing a semiconductor device according to some example embodiments of the inventive concepts.

Referring to FIG. 1, a semiconductor device 10 may include a plurality of cell array regions 12. Memory cells may be disposed on the plurality of cell array regions 12.

The plurality of cell array regions 12 may be provided therearound with column decoder regions 14, row decoder regions 16, and a TSV (through-silicon-via) region 20.

Column decoders may be disposed on the column decoder regions 14. The column decoders may decode received addresses to select column lines of the cell array regions 12. Row decoders may be disposed on the row decoder regions 16. The row decoders may decode received addresses to output row addresses for selecting row lines of the cell array regions 12. A plurality of TSV electrodes 22 may be disposed on the TSV region 20. The semiconductor device 10 may receive a signal through the TSV electrodes 22 from the outside, or may transmit a signal through the TSV electrodes 22 to the outside.

In some example embodiments, as illustrated in FIG. 1, the TSV region 20 may occupy a central portion of the semiconductor device 10, when viewed in plan. However, example embodiments of inventive concepts are not limited thereto, and a planar position of the TSV region 20 may be variously modified.

Figure 2:
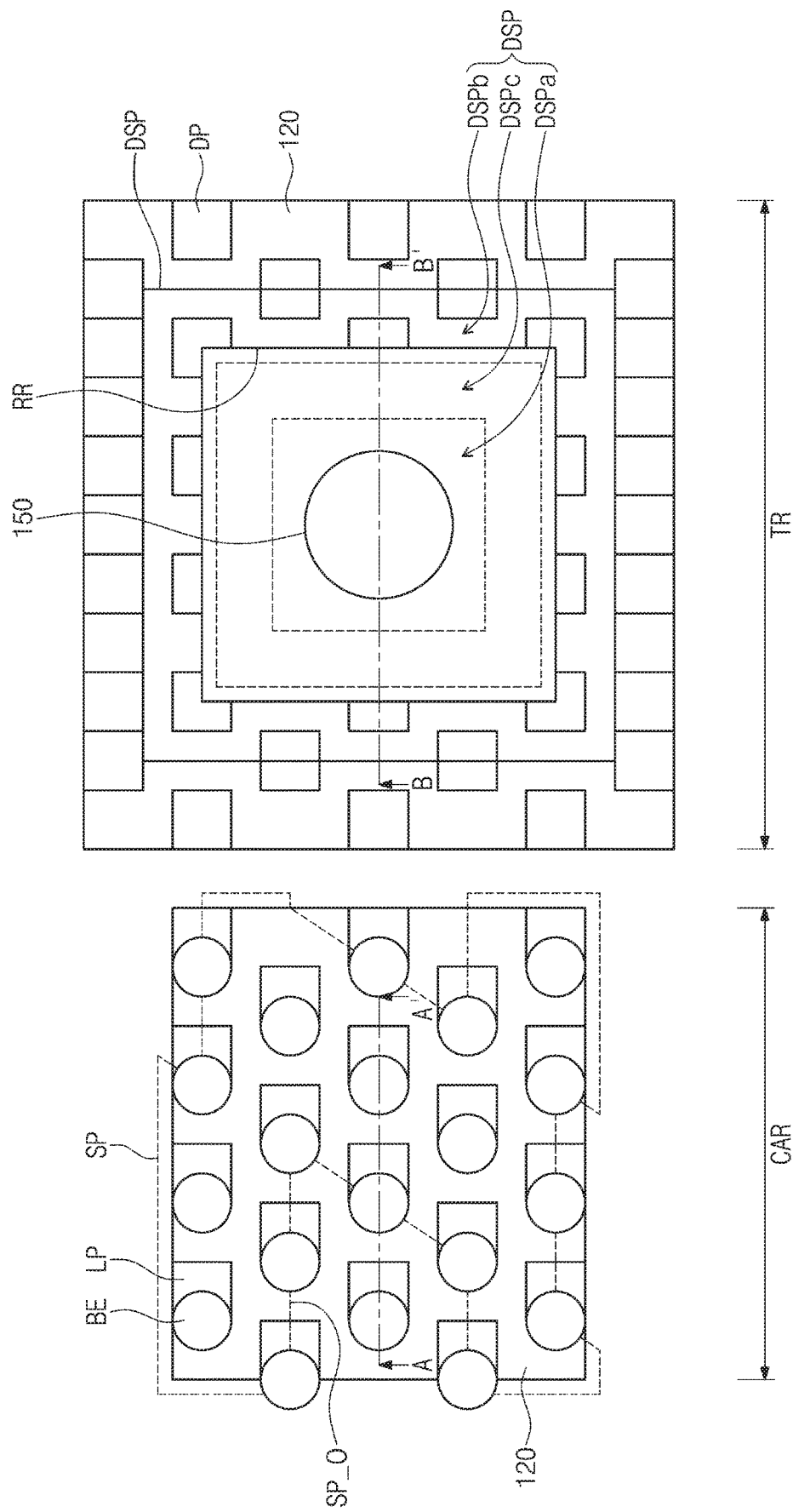
FIG. 2 illustrates a plan view showing a semiconductor device according to some example embodiments of the inventive concepts.
Figure 3:
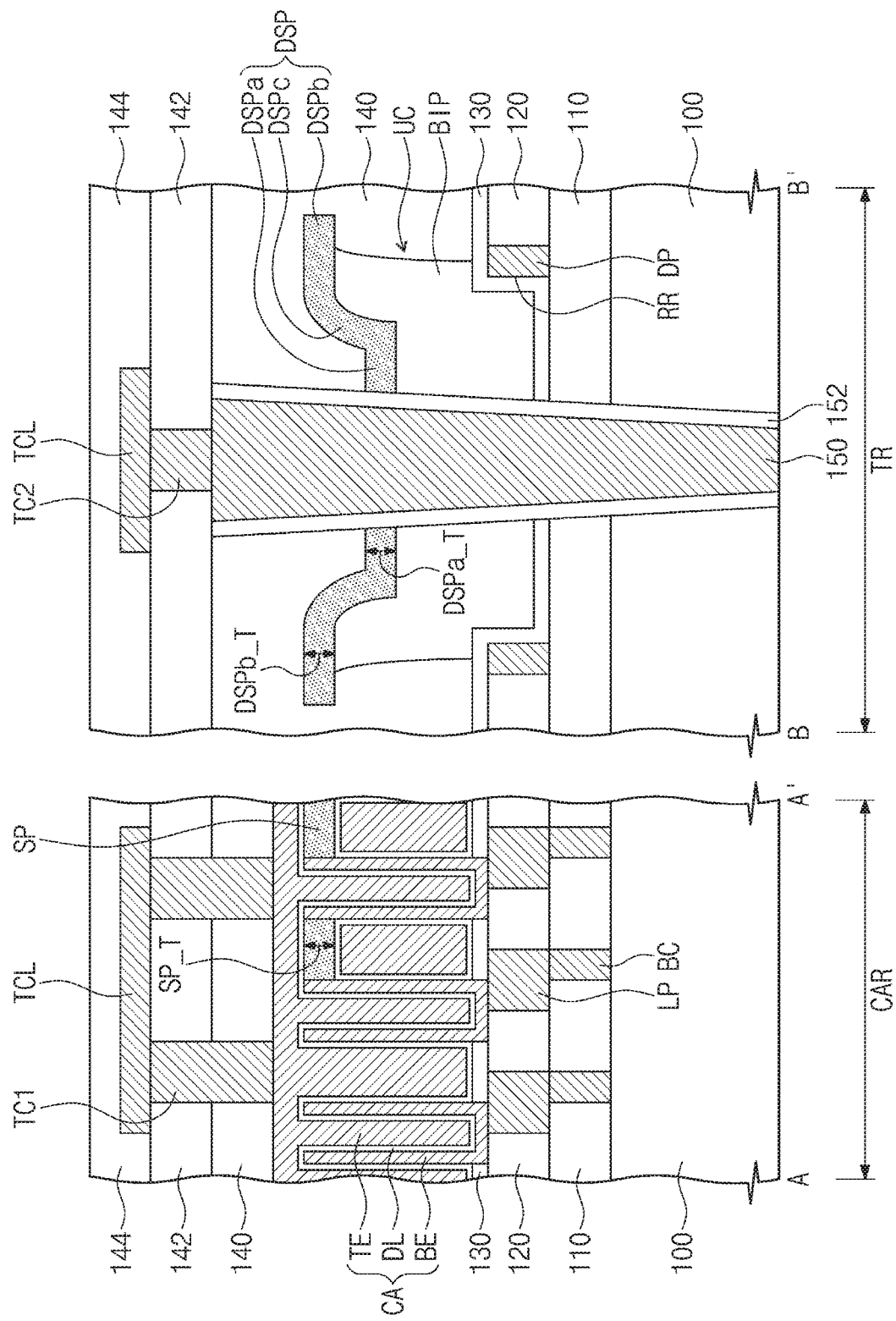
FIG. 3 illustrates a cross-sectional view showing a semiconductor device according to some example embodiments of the inventive concepts.

FIG. 2 illustrates a plan view showing a semiconductor device according to some example embodiments of the inventive concepts. FIG. 3 illustrates a cross-sectional view showing a semiconductor device according to some example embodiments of the inventive concepts. For example, FIG. 3 is a cross-sectional view taken along lines A-A' and B-B' of FIG. 2.

Referring to FIGS. 2 and 3, a substrate 100 may be provided. The substrate 100 may include a semiconductor substrate. For example, the substrate 100 may include a silicon substrate, a germanium substrate, or a silicon-germanium substrate.

The substrate 100 may include a cell array region CAR and a TSV region TR. The cell array region CAR may correspond to one of the cell array regions 12 discussed with reference to FIG. 1, and the TSV region TR may correspond to the TSV region 20 discussed with reference to FIG. 1.

Transistors (not shown) may be provided on the cell array region CAR of the substrate 100. The substrate 100 may be provided therein with some components (e.g., source and drain regions) of the transistors. No transistors may be provided on the TSV region TR of the substrate 100.

A lower insulation layer 110 may be provided on the substrate 100. The lower insulation layer 110 may cover the transistors on the cell array region CAR. For example, the lower insulation layer 110 may include a silicon oxide layer, a silicon nitride layer, and/or a silicon oxynitride layer.

Bottom contacts BC may be provided in the lower insulation layer 110. The bottom contacts BC may be electrically coupled to terminals of the transistors. For example, the bottom contacts BC may include impurity-doped semiconductor (e.g., doped silicon, doped germanium, or doped silicon-germanium), metal (e.g., titanium, tantalum, or tungsten), conductive metal nitride (e.g., titanium nitride or tantalum nitride), and/or metal-semiconductor compound (e.g., metal silicide).

Landing pads LP may be disposed on the lower insulation layer 110 of the cell array region CAR. The landing pads LP may be spaced apart from each other and may be two-dimensionally arranged. The landing pads LP may be coupled to corresponding bottom contacts BC. For example, the landing pads LP may include impurity-doped semiconductor, metal, conductive metal nitride, and/or metal-semiconductor compound.

Dummy pads DP may be provided on the lower insulation layer 110 of the TSV region TR. The dummy pads DP may be spaced apart from each other and may be two-dimensionally arranged. The dummy pads DP may be positioned at substantially the same level as that of the landing pads LP. In this description, the term of level may mean a height from a top surface of the substrate 100. For example, the dummy pads DP may have top surfaces at substantially the same level as that of top surfaces of the landing pads LP. The dummy pads DP may include the same material as that of the landing pads LP. For example, the dummy pads DP may include impurity-doped semiconductor, metal, conductive metal nitride, and/or metal-semiconductor compound.

When a pad insulation layer 120 is formed in a subsequent process which will be discussed below, the dummy pads DP may suppress a dishing phenomenon in which a central portion of the pad insulation layer 120 is concavely recessed on the TSV region TR. This will be further discussed in detail with reference to FIG. 9C.

The pad insulation layer 120 may be provided on the lower insulation layer 110. The pad insulation layer 120 may fill between the landing pads LP and the dummy pads DP. The pad insulation layer 120 may have a top surface at substantially the same level as that of the top surfaces of the landing pads LP and that of the top surfaces of the dummy pads DP. For example, the pad insulation layer 120 may include a silicon oxide layer, a silicon nitride layer, and/or a silicon oxynitride layer.

On the TSV region TR, the pad insulation layer 120 may include a recess region RR. The recess region RR may have a floor surface lower than the top surface of the pad insulation layer 120. The recess region RR may expose a top surface of the lower insulation layer 110. In some example embodiments, differently from that illustrated in FIG. 3, the recess region RR may extend into the lower insulation layer 110. No dummy pads DP may be provided within the recess region RR.

In some example embodiments, as illustrated in FIGS. 2 and 3, the recess region RR may have an inner sidewall that exposes sidewalls of some of the dummy pads DP. For example, the inner sidewall of the recess region RR may include the sidewalls of some of the dummy pads DP. In other example embodiments, differently from that illustrated in FIGS. 2 and 3, the inner sidewall of the recess region RR may not expose sidewalls of the dummy pads DP.

An etch stop layer 130 may be provided on the pad insulation layer 120. The etch stop layer 130 may cover the top surface of the pad insulation layer 120, the top surfaces of the landing pads LP, and the top surfaces of the dummy pads DP. The etch stop layer 130 may conformally cover the inner sidewall and the floor surface of the recess region RR. The etch stop layer 130 may include an insulation layer. For example, the etch stop layer 130 may include a silicon nitride layer.

Bottom electrodes BE may be provided on the pad insulation layer 120 of the cell array region CAR. The bottom electrodes BE may be spaced apart from each other and may be two-dimensionally arranged. The bottom electrodes BE may penetrate the etch stop layer 130 to come into electrical connection with corresponding lading pads LP. For example, the bottom electrodes BE may include impurity-doped semiconductor, metal, conductive metal nitride, and/or metal-semiconductor compound.

As illustrated in FIG. 3, each of the bottom electrodes BE may have a hollow cylindrical shape having a floor segment and a sidewall segment that extends from the floor segment in a direction substantially perpendicular to the top surface of the substrate 100. However, the shapes of the bottom electrodes BE are not limited thereto, and may be variously modified. For example, differently from that illustrated in FIG. 3, each of the bottom electrodes BE may have a pillar shape extending in a perpendicular direction to the top surface of the substrate 100.

A support pattern SP may be provided on upper sidewalls of the bottom electrodes BE. The support pattern SP may be connected to the upper sidewalls of the bottom electrodes BE, and may support the bottom electrodes BE from collapsing. The support pattern SP may include openings SP_O. For example, when viewed in plan, each of the openings SP_O may have a bar shape, a rectangular shape, or a linear shape. The support pattern SP may include, for example, silicon nitride and/or silicon carbon nitride.

A dielectric layer DL may be provided to conformally cover surfaces of the bottom electrodes BE. The dielectric layer DL may extend onto a surface of the support pattern SP and onto a surface of the etch stop layer 130 of the cell array region CAR. For example, the dielectric layer DL may be provided to have a uniform thickness on the surfaces of the bottom electrodes BE, on the surface of the etch stop layer 130 of the cell array region CAR, and on the surface of the support pattern SP. For example, the dielectric layer DL may include silicon oxide, silicon nitride, metal oxide (e.g., hafnium oxide, zirconium oxide, aluminum oxide, tantalum oxide, titanium oxide), and/or perovskite-structured dielectric (e.g., $SrTiO_3$(STO), $(Ba,Sr)TiO_3$(BST), $BaTiO_3$, PZT, PLZT).

A top electrode TE may be provided to cover the bottom electrodes BE. The top electrode TE may be spaced apart from the bottom electrodes BE across the dielectric layer DL. When each of the bottom electrodes BE has a hollow cylindrical shape as illustrated in FIG. 3, the top electrode TE may fill inside spaces of the bottom electrodes BE. The top electrode TE may include impurity-doped semiconductor, metal, conductive metal nitride, and/or metal-semiconductor compound.

The bottom electrodes BE, the dielectric layer DL, and the top electrode TE may constitute a plurality of capacitors CA. Each of the plurality of capacitors CA may include a single bottom electrode BE. The dielectric layer DL and the top electrode TE may be shared by the plurality of capacitors CA.

On the TSV region TR, a dummy support pattern DSP may be provided above the lower insulation layer 110 and the pad insulation layer 120. The dummy support pattern DSP may include the same material as that of the support pattern SP. For example, the dummy support pattern DSP may include silicon nitride and/or silicon carbon nitride.

When viewed in plan, the dummy support pattern DSP may overlap the recess region RR. When viewed in plan, the dummy support pattern DSP may include a first segment DSPa at its center, a second segment DSPb around the first segment DSPa, and a third segment DPSc that lies between and connects the first and second segments DSPa and DSPb. When viewed in plan, the second segment DSPb of the dummy support pattern DSP may surround the first segment DSPa of the dummy support pattern DSP. When viewed in plan, the first segment DSPa of the dummy support pattern DSP may overlap the recess region RR. When viewed in plan, the second segment DSPb of the dummy support pattern DSP may not at least partially overlap the recess region RR. When viewed in plan, the dummy support pattern DSP may have an area greater than that of the recess region RR.

The first segment DSPa of the dummy support pattern DSP may be positioned below the second segment DSPb of the dummy support pattern DSP. The second segment DSPb of the dummy support pattern DSP may be positioned at substantially the same level as that of the support pattern SP, and the first segment DSPa of the dummy support pattern DSP may be positioned lower than the support pattern SP. The dummy support pattern DSP may have a bottommost surface (or a bottom surface of the first segment DSPa) lower than a bottom surface of the support pattern SP. The dummy support pattern DSP may have a topmost surface (or a top surface of the second segment DSPb) at substantially the same level as that of a top surface of the support pattern SP. A thickness DSPa_T of the first segment DSPa of the dummy support pattern DSP, a thickness DSPb_T of the second segment DSPb of the dummy support pattern DSP, and a thickness SP_T of the support pattern SP may be substantially the same as each other.

A buried insulation pattern BIP may be provided between the dummy support pattern DSP and the lower insulation layer 110. The buried insulation pattern BIP may fill the recess region RR. The buried insulation pattern BIP may extend between the dummy support pattern DSP and the pad insulation layer 120 (or the dummy pads DP). The buried insulation pattern BIP may have a sidewall that is laterally recessed from a sidewall of the dummy support pattern DSP. In this configuration, an undercut UC may be defined underneath the second segment DSPb of the dummy support pattern DSP. The buried insulation pattern BIP may include a material having an etch selectivity to the dummy support pattern DSP and the support pattern SP. For example, the buried insulation pattern BIP may include silicon oxide.

The dummy support pattern DSP and the buried insulation pattern BIP may cause a first upper insulation layer 140, which will be discussed below, to relatively uniformly formed, compared to the case that none of the dummy support pattern DSP and the buried insulation pattern BIP is provided. This will be further discussed in detail with reference to FIGS. 9J and 9K.

A first upper insulation layer 140 may be provided to cover the top electrode TE, the dummy support pattern DSP, and the buried insulation pattern BIP. The first upper insulation layer 140 may fill the first undercut UC. The first upper insulation layer 140 may have a flat top surface. For example, a top surface of the first upper insulation layer 140 on the cell array region CAR may be positioned at substantially the same level as that of a top surface of the first upper insulation layer 140 on the TSV region TR. The first upper insulation layer 140 may include, for example, a silicon oxide layer, a silicon nitride layer, and/or a silicon oxynitride layer.

A TSV electrode 150 may be provided on the TSV region TR. The TSV electrode 150 may penetrate the substrate 100, the lower insulation layer 110, the etch stop layer 130, the buried insulation pattern BIP, the dummy support pattern DSP, and the first upper insulation layer 140. For example, the TSV electrode 150 may penetrate the first segment DSPa of the dummy support pattern DSP. The TSV electrode 150 may pass through the recess region RR of the pad insulation layer 120. The TSV electrode 150 may include a conductive material. For example, the TSV electrode 150 may include impurity-doped semiconductor, metal, conductive metal nitride, and/or metal-semiconductor compound. The TSV electrode 150 may correspond to the TSV electrode 22 discussed with reference to FIG. 1.

In some example embodiments, as illustrated in FIG. 3, the TSV electrode 150 may have one end substantially coplanar with the top surface of the first upper insulation layer 140 and have an opposite end substantially coplanar with a bottom surface of the substrate 100. However, example embodiments of the inventive concepts are not limited thereto.

A through insulation pattern 152 may be provided on a sidewall of the TSV electrode 150. The through insulation pattern 152 may have an end substantially coplanar with the one end of the TSV electrode 150 and have an opposite end substantially coplanar with the opposite end of the TSV electrode 150. For example, the through insulation pattern 152 may include a silicon oxide layer, a silicon nitride layer, and/or a silicon oxynitride layer.

A second upper insulation layer 142 may be provided on the first upper insulation layer 140. The second upper insulation layer 142 may cover the one end of the TSV electrode 150. For example, the second upper insulation layer 142 may include a silicon oxide layer, a silicon nitride layer, and/or a silicon oxynitride layer.

First top contacts TC1 may be provided to come into electrical connection with the top electrode TE. The first top contacts TC1 may penetrate the first and second upper insulation layers 140 and 142. A second top contact TC2 may be provided to come into electrical connection with the TSV electrode 150. The second top contact TC2 may penetrate the second upper insulation layer 142. For example, the first and second top contacts TC1 and TC2 may include impurity-doped semiconductor, metal, conductive metal nitride, and/or metal-semiconductor compound.

Top connection lines TCL may be provided on the upper insulation layer 142. The top connection lines TCL may be electrically connected to the first top contacts TC1 and the second top contact TC2. For example, the top connection lines TCL may include impurity-doped semiconductor, metal, conductive metal nitride, and/or metal-semiconductor compound.

A third upper insulation layer 144 may be provided on the second upper insulation layer 142. The third upper insulation layer 144 may cover the top connection lines TCL. For example, the third upper insulation layer 144 may include a silicon oxide layer, a silicon nitride layer, and/or a silicon oxynitride layer.

Figure 4:
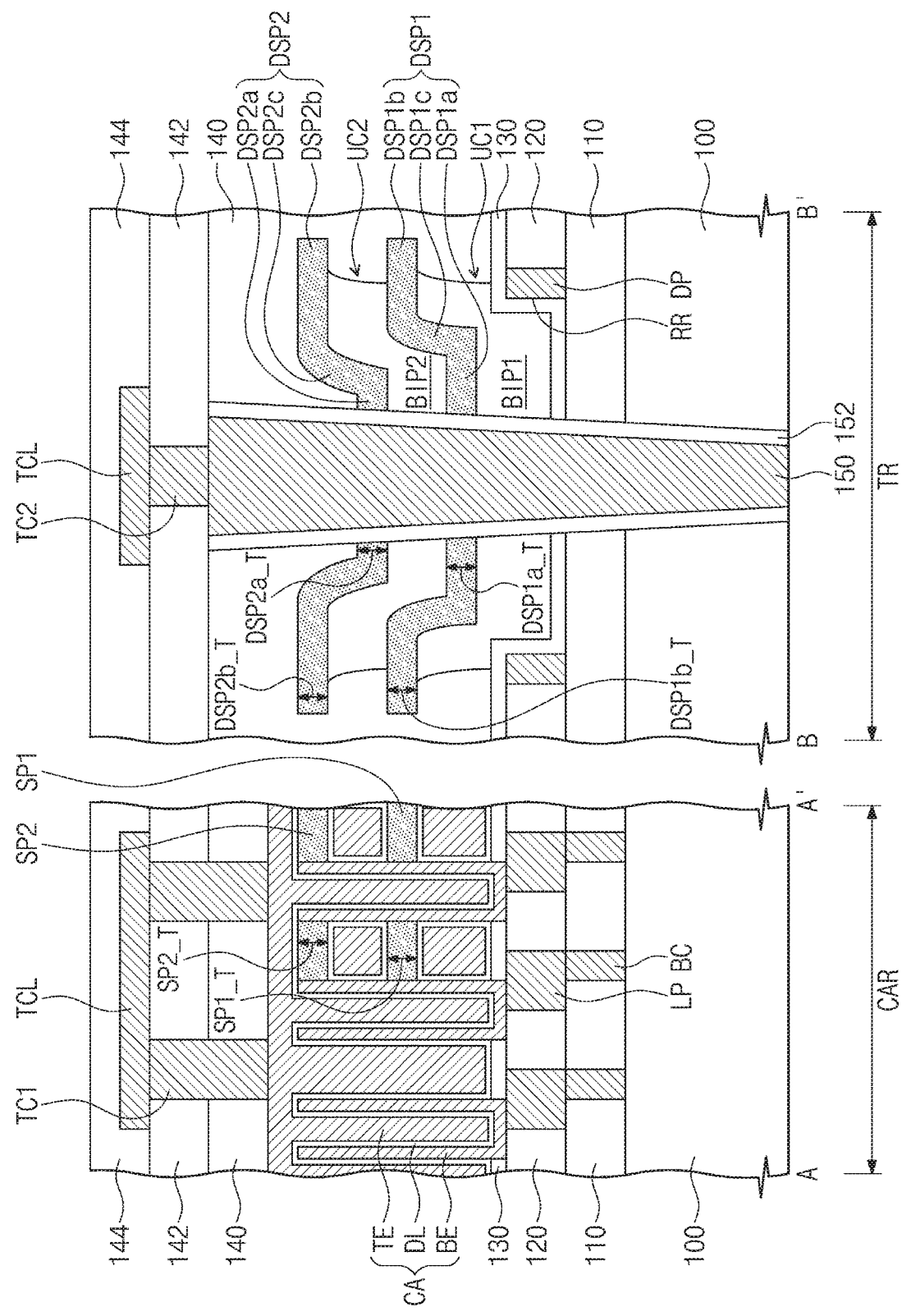
FIG. 4 illustrates a cross-sectional view showing a semiconductor device according to some example embodiments of the inventive concepts.

FIG. 4 illustrates a cross-sectional view showing a semiconductor device according to some example embodiments of the inventive concepts. For example, FIG. 4 is a cross-sectional view taken along lines A-A' and B-B' of FIG. 2. In the example embodiments that follow, components substantially the same as those discussed with reference to FIGS. 2 and 3 are allocated the same reference numerals thereto, and a repetitive explanation thereof will be omitted for brevity of description.

Referring to FIGS. 2 and 4, each of the support pattern SP, the dummy support pattern DSP, and the buried insulation pattern BIP discussed with reference to FIG. 3 may be provided in plural. For example, there may be provided first and second support patterns SP1 and SP2, first and second dummy support patterns DSP1 and DSP2, and first and second buried insulation patterns BIP1 and BIP2. Components other than those mentioned above may be substantially the same as those with reference to FIG. 3.

The first and second support patterns SP2 may be provided on sidewalls of the bottom electrodes BE. The second support pattern SP2 may be connected to upper sidewalls of the bottom electrodes BE, and the first support pattern SP1 may be connected to middle sidewalls of the bottom electrodes BE to which the second support pattern SP2 is connected. The first and second support patterns SP1 and SP2 may support the bottom electrodes BE from collapsing. The first support pattern SP1 may include first openings, and the second support pattern SP2 may include second openings. When viewed in plan, the first openings may overlap corresponding second openings. The first and second support patterns SP1 and SP2 may include, for example, silicon nitride and/or silicon carbon nitride.

On the TSV region TR, the first dummy pattern DSP1 may be provided above the lower insulation layer 110 and the pad insulation layer 120. The first dummy support pattern DSP1 may include the same material as that of the first support pattern SP1. For example, the first dummy support pattern DSP1 may include silicon nitride and/or silicon carbon nitride.

When viewed in plan, the first dummy support pattern DSP1 may overlap the recess region RR. When viewed in plan, the first dummy support pattern DSP1 may include a first segment DSP1$a$ at its center, a second segment DSP1$b$ around the first segment DSP1$a$, and a third segment DSP1$c$ that lies between and connects the first and second segments DSP1$a$ and DSP1$b$. When viewed in plan, the second segment DSP1$b$ of the first dummy support pattern DSP1 may surround the first segment DSP1$a$ of the first dummy support pattern DSP1. When viewed in plan, the first segment DSP1$a$ of the first dummy support pattern DSP1 may overlap the recess region RR. When viewed in plan, the second segment DSP1$b$ of the first dummy support pattern DSP1 may not at least partially overlap the recess region RR. When viewed in plan, the first dummy support pattern DSP1 may have an area greater than that of the recess region RR.

The first segment DSP1$a$ of the first dummy support pattern DSP1 may be positioned below the second segment DSP1$b$ of the first dummy support pattern DSP1. The second segment DSP1$b$ of the first dummy support pattern DSP1 may be positioned at substantially the same level as that of the first support pattern SP1, and the first segment DSP1$a$ of the first dummy support pattern DSP1 may be positioned lower than the first support pattern SP1. The first dummy support pattern DSP1 may have a bottommost surface (or a bottom surface of the first segment DSP1$a$) lower than a bottom surface of the first support pattern SP1. The first dummy support pattern DSP1 may have a topmost surface (or a top surface of the second segment DSP1$b$) at substantially the same level as that of a top surface of the first support pattern SP1. A thickness DSP1$a$_T of the first segment DSP1$a$ of the first dummy support pattern DSP1, a thickness DSP1$b$_T of the second segment DSP1$b$ of the first dummy support pattern DSP1, and a thickness SP1_T of the first support pattern SP1 may be substantially the same as each other.

The first buried insulation pattern BIP1 may be provided between the first dummy support pattern DSP1 and the lower insulation layer 110. The first buried insulation pattern BIP1 may fill the recess region RR. The first buried insulation pattern BIP1 may extend between the second segment DSP1$b$ of the first dummy support pattern DSP1 and the pad insulation layer 120 (or the dummy pads DP). The first buried insulation pattern BIP1 may have a sidewall that is laterally recessed from a sidewall of the first dummy support pattern DSP1. In this configuration, a first undercut UC1 may be defined underneath the second segment DSP1$b$ of the first dummy support pattern DSP1. The first buried insulation pattern BIP1 may include a material having an etch selectivity to the first dummy support pattern DSP1 and the first support pattern SP1. For example, the first buried insulation pattern BIP1 may include silicon oxide.

The second dummy support pattern DSP2 may be provided above the first dummy support pattern DSP1. The second dummy support pattern DSP2 may include the same material as that of the second support pattern SP2. For example, the second dummy support pattern DSP2 may include silicon nitride and/or silicon carbon nitride.

When viewed in plan, the second dummy support pattern DSP2 may overlap the recess region RR. When viewed in plan, the second dummy support pattern DSP2 may include a first segment DSP2$a$ at its center, a second segment DSP2$b$ around the first segment DSP2$a$, and a third segment DSP2$c$ that lies between and connects the first and second segments DSP2$a$ and DSP2$b$. When viewed in plan, the second segment DSP2$b$ of the second dummy support pattern DSP2 may surround the first segment DSP2$a$ of the second dummy support pattern DSP2. When viewed in plan, the first segment DSP2$a$ of the second dummy support pattern DSP2 may overlap the recess region RR. When viewed in plan, the second segment DSP2$b$ of the second dummy support pattern DSP2 may not at least partially overlap the recess region RR. When viewed in plan, the second dummy support pattern DSP2 may have an area greater than that of the recess region RR.

When viewed in plan, the second dummy support pattern DSP2 may overlap the first dummy support pattern DSP. When viewed in plan, the second dummy support pattern DSP2 may have an area substantially the same as that of the first dummy support pattern DSP1.

The first segment DSP2a of the second dummy support pattern DSP2 may be positioned below the second segment DSP2b of the second dummy support pattern DSP2. The second segment DSP2b of the second dummy support pattern DSP2 may be positioned at substantially the same level as that of the second support pattern SP2, and the first segment DSP2a of the second dummy support pattern DSP2 may be positioned lower than the second support pattern SP2. The second dummy support pattern DSP2 may have a bottommost surface (or a bottom surface of the first segment DSP2a) lower than a bottom surface of the second support pattern SP2. The second dummy support pattern DSP2 may have a topmost surface (or a top surface of the second segment DSP2b) at substantially the same level as that of a top surface of the second support pattern SP2. A thickness DSP2a_T of the first segment DSP2a of the second dummy support pattern DSP2, a thickness DSP2b_T of the second segment DSP2b of the second dummy support pattern DSP2, and a thickness SP2_T of the second support pattern SP2 may be substantially the same as each other.

The second buried insulation pattern BIP2 may be provided between the second dummy support pattern DSP2 and the first dummy support pattern DSP1. The second buried insulation pattern BIP2 may have a sidewall that is laterally recessed from a sidewall of the second dummy support pattern DSP2. In this configuration, a second undercut UC2 may be defined underneath the second segment DSP2b of the second dummy support pattern DSP2. The second buried insulation pattern BIP2 may include a material having an etch selectivity to the second dummy support pattern DSP2 and the second support pattern SP2. For example, the second buried insulation pattern BIP2 may include silicon oxide.

The first upper insulation layer 140 may be provided to cover the top electrode TE, the first and second dummy support patterns DSP1 and DSP2, and the first and second buried insulation patterns BIP1 and BIP2. The first upper insulation layer 140 may fill the first and second undercuts UC1 and UC2.

The TSV electrode 150 may be provided on the TSV region TR. The TSV electrode 150 may penetrate the substrate 100, the lower insulation layer 110, the etch stop layer 130, the first buried insulation pattern BIP1, the first dummy support pattern DSP1, the second buried insulation pattern BIP2, the second dummy support pattern DSP2, and the first upper insulation layer 140. For example, the TSV electrode 150 may penetrate the first segment DSP a of the first dummy support pattern DSP1 and the first segment DSP2a of the second dummy support pattern DSP2. The TSV electrode 150 may pass through the recess region RR of the pad insulation layer 120.

Figure 5:
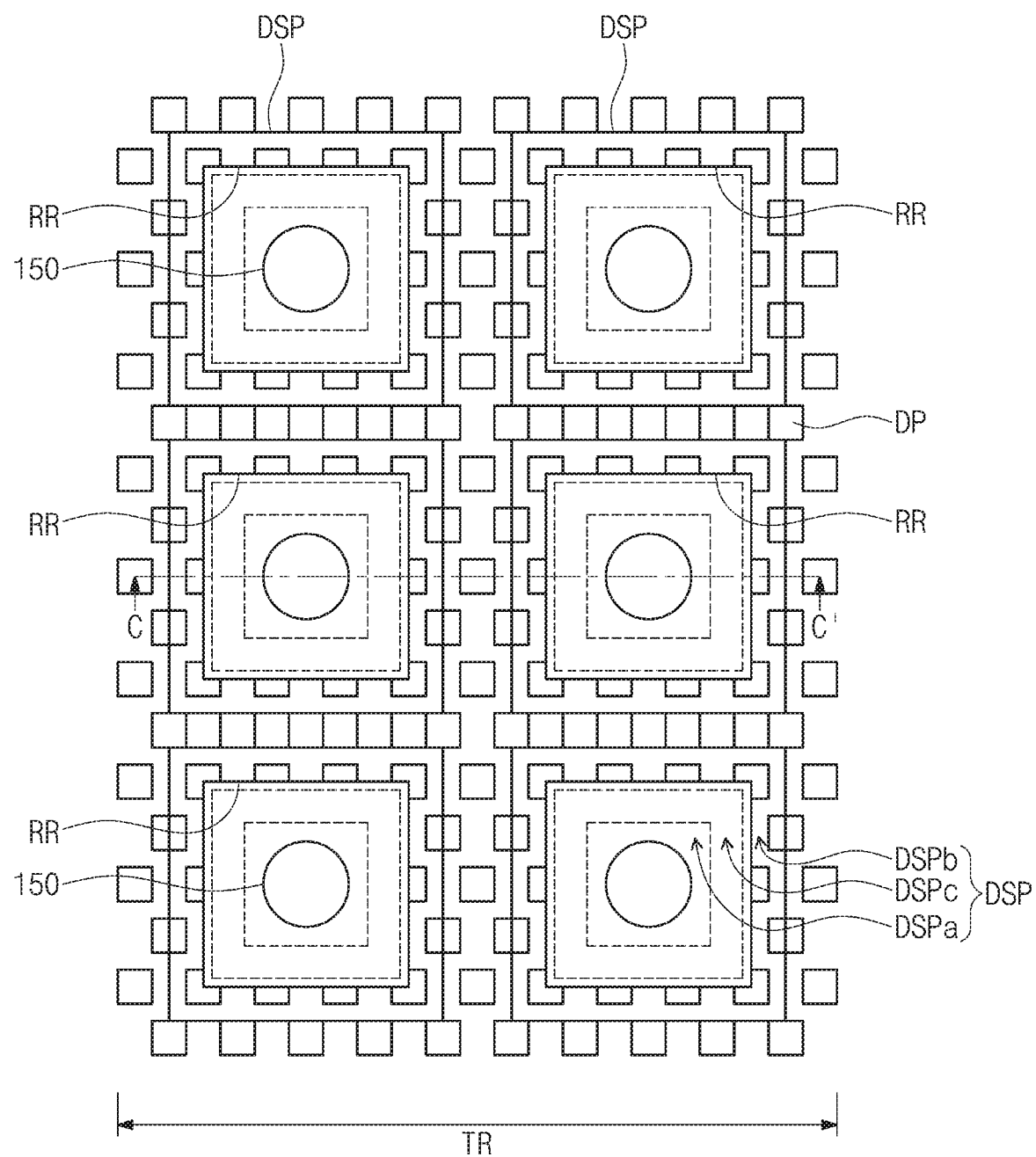
FIG. 5 illustrates a plan view showing a TSV region of a semiconductor device according to some example embodiments of the inventive concepts.
Figure 6:
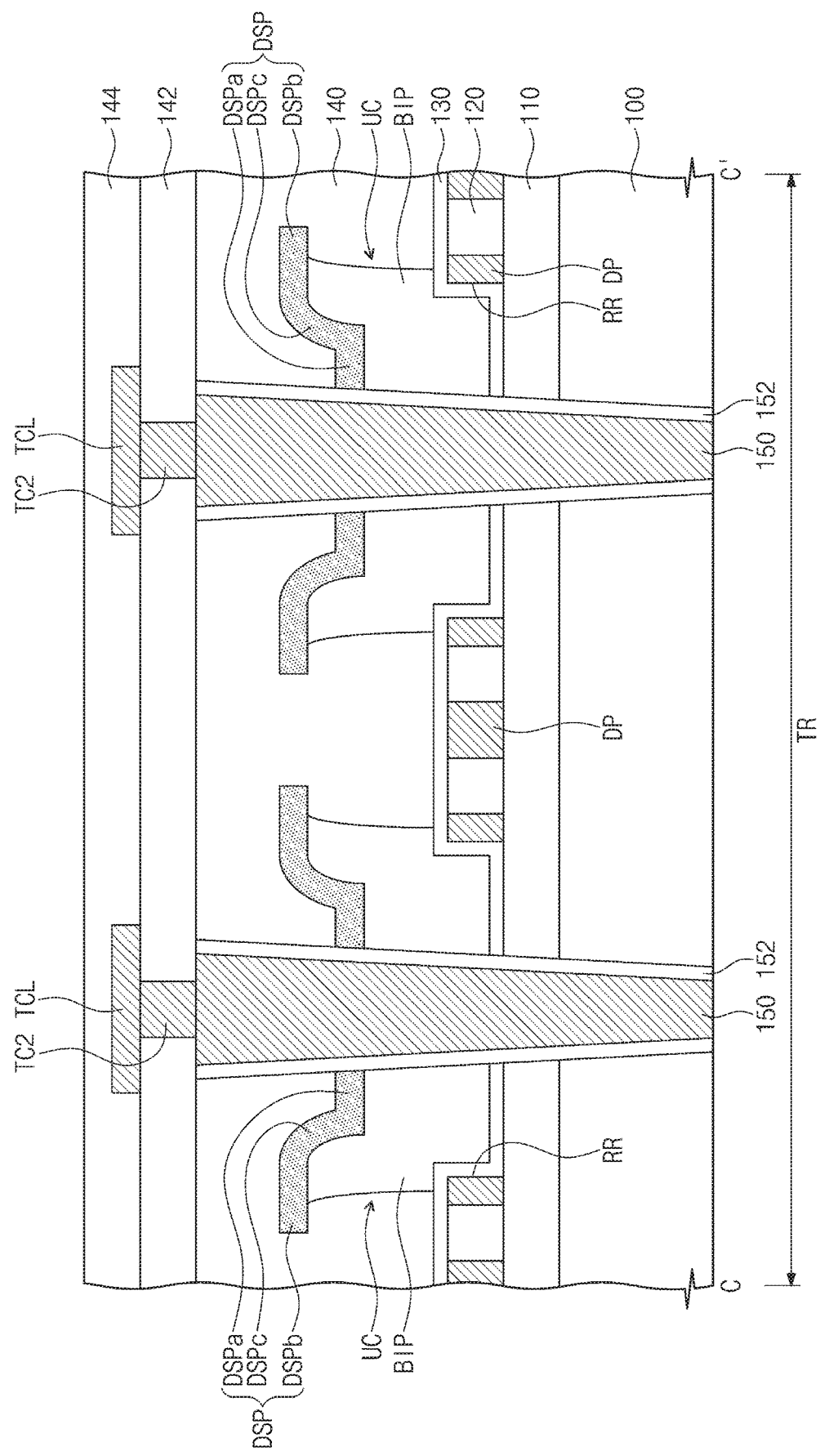
FIG. 6 illustrates a cross-sectional view showing a TSV region of a semiconductor device according to some example embodiments of the inventive concepts.

FIG. 5 illustrates a plan view showing a TSV region of a semiconductor device according to some example embodiments of the inventive concepts. FIG. 6 illustrates a cross-sectional view showing a TSV region of a semiconductor device according to some example embodiments of the inventive concepts. For example, FIG. 6 is a cross-sectional view taken along line C-C' of FIG. 5. In the example embodiments that follow, components substantially the same as those discussed with reference to FIGS. 2 and 3 are allocated the same reference numerals thereto, and a repetitive explanation thereof will be omitted for brevity of description. A cell array region of the semiconductor device may be substantially the same as that discussed with reference to FIGS. 2 and 3. An explanation about the cell array region of the semiconductor device will be omitted for brevity of description.

Referring to FIGS. 5 and 6, on the TSV region TR of the substrate 100, the pad insulation layer 120 may include a plurality of recess regions RR. The plurality of recess regions RR may be spaced apart from each other. The dummy pads DP may be disposed between the plurality of recess regions RR. Each of the plurality of recess regions RR may be substantially the same as the recess region RR discussed with reference to FIGS. 2 and 3.

On the TSV region TR, a plurality of dummy support patterns DSP may be provided above the lower insulation layer 110 and the pad insulation layer 120. The plurality of dummy support patterns DSP may be spaced apart from each other. When viewed in plan, the plurality of dummy support patterns DSP may overlap corresponding plurality of recess regions RR. Each of the plurality of dummy support patterns DSP may be substantially the same as the dummy support pattern DSP discussed with reference to FIGS. 2 and 3.

A plurality of buried insulation patterns BIP may be correspondingly provided between the plurality of dummy support patterns DSP and the lower insulation layer 110. The plurality of buried insulation patterns BIP may be spaced apart from each other. The plurality of buried insulation patterns BIP may fill corresponding plurality of recess regions RR. Each of the plurality of buried insulation patterns BIP may be substantially the same as the buried insulation pattern BIP discussed with reference to FIGS. 2 and 3.

The first upper insulation layer 140 on the TSV region TR may cover the plurality of dummy support patterns DSP and the plurality of buried insulation patterns BIP. The first upper insulation layer 140 may fill a plurality of undercuts UC underneath second segments DSPb of the plurality of dummy support patterns DSP.

A plurality of TSV electrodes 150 may be provided on the TSV region TR. The plurality of TSV electrodes 150 may pass through corresponding plurality of recess regions RR. Each of the plurality of TSV electrodes 150 may be substantially the same as that discussed with reference to FIGS. 2 and 3.

Figure 7:
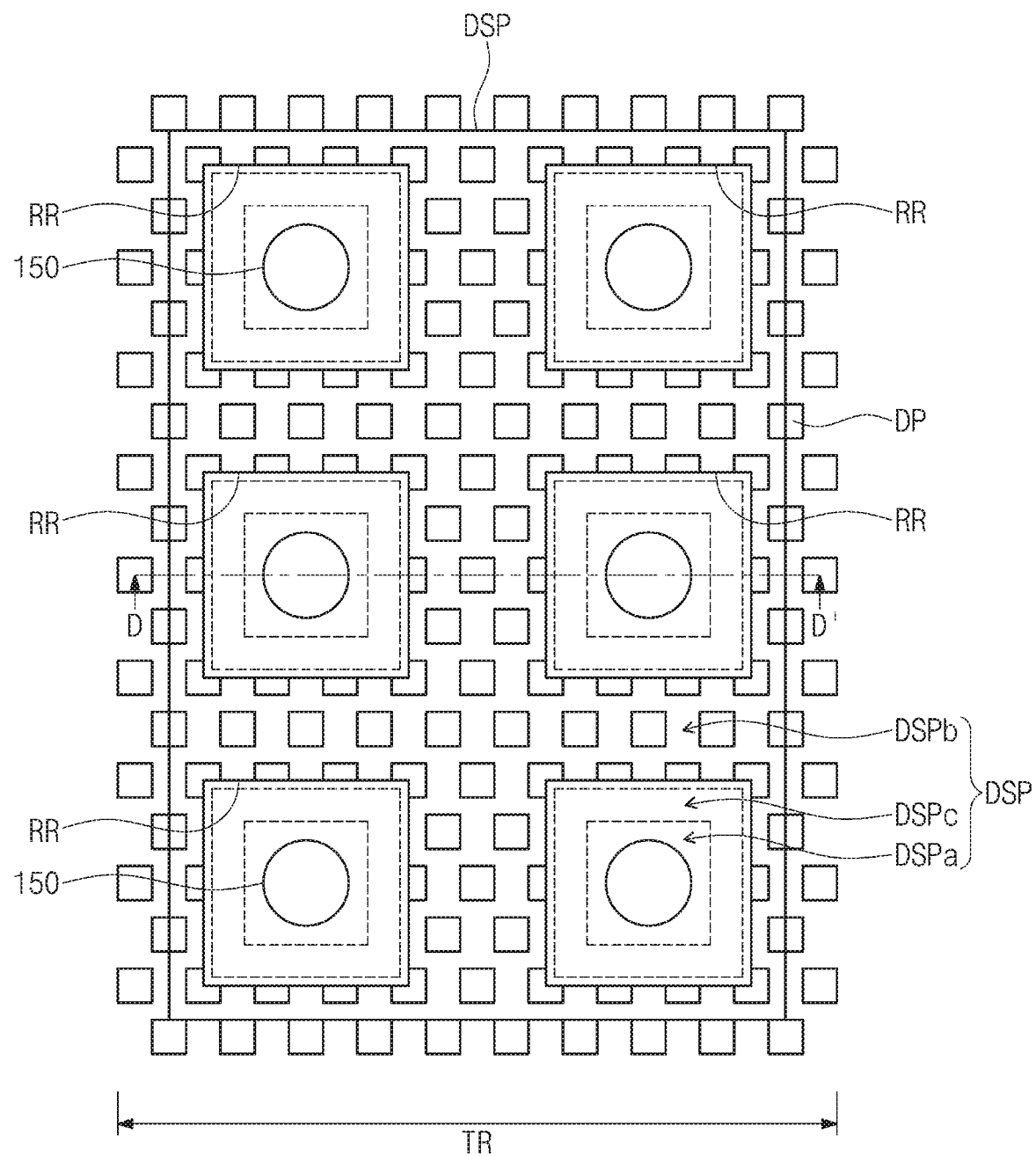
FIG. 7 illustrates a plan view showing a TSV region of a semiconductor device according to some example embodiments of the inventive concepts.
Figure 8:
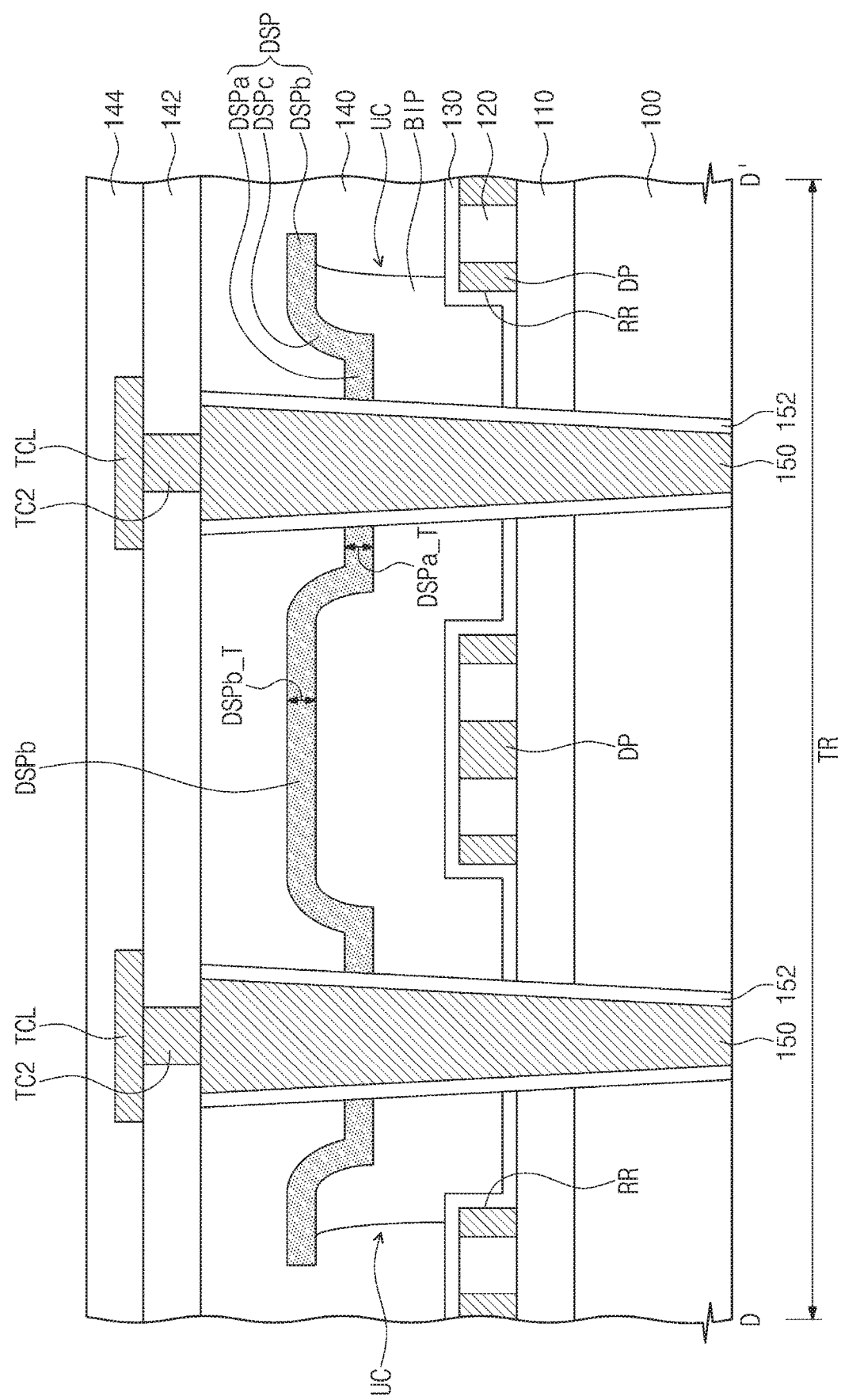
FIG. 8 illustrates a cross-sectional view showing a TSV region of a semiconductor device according to some example embodiments of the inventive concepts.

FIG. 7 illustrates a plan view showing a TSV region of a semiconductor device according to some example embodiments of the inventive concepts. FIG. 8 illustrates a cross-sectional view showing a TSV region of a semiconductor device according to some example embodiments of the inventive concepts. For example, FIG. 8 is a cross-sectional view taken along line D-D' of FIG. 7. In the example embodiments that follow, components substantially the same as those discussed with reference to FIGS. 2 and 3 are allocated the same reference numerals thereto, and a repetitive explanation thereof will be omitted for brevity of description. A cell array region of the semiconductor device may be substantially the same as that discussed with reference to FIGS. 2 and 3. An explanation about the cell array region of the semiconductor device will be omitted for brevity of description.

Referring to FIGS. 7 and 8, on the TSV region TR of the substrate 100, the pad insulation layer 120 may include a plurality of recess regions RR. The plurality of recess regions RR may be spaced apart from each other. The dummy pads DP may be disposed between the plurality of recess regions RR. Each of the plurality of recess regions RR may be substantially the same as the recess region RR discussed with reference to FIGS. 2 and 3.

On the TSV region TR, the dummy support pattern DSP may be provided above the lower insulation layer 110 and the pad insulation layer 120. The dummy support pattern DSP may include the same material as that of the support pattern SP. For example, the dummy support pattern DSP may include silicon nitride and/or silicon carbon nitride.

When viewed in plan, the dummy support pattern DSP may overlap the plurality of recess regions RR. When viewed in plan, the dummy support pattern DSP may include a plurality of first segments DSPa overlapping corresponding plurality of recess regions RR, a second segment DSPb around the plurality of first segments DSPa, and a plurality of third segments DPSc that lie between and connect the plurality of first segments DSPa and the second segment DSPb. The second segment DSPb may include a portion surrounding edges of the first segments DSPa and a portion extending between the first segments DSPa. When viewed in plan, the second segment DSPb of the dummy support pattern DSP may surround the plurality of first segments DSPa of the dummy support pattern DSP. When viewed in plan, the second segment DSPb of the dummy support pattern DSP may not at least partially overlap the recess region RR.

The plurality of first segments DSPa of the dummy support pattern DSP may be positioned below the second segment DSPb of the dummy support pattern DSP. The second segment DSPb of the dummy support pattern DSP may be positioned at substantially the same level as that of the support pattern SP, and the plurality of first segments DSPa of the dummy support pattern DSP may be positioned lower than the support pattern SP. The dummy support pattern DSP may have a bottommost surface (or bottom surfaces of the plurality of first segments DSPa) lower than a bottom surface of the support pattern SP. The dummy support pattern DSP may have a topmost surface (or a top surface of the second segment DSPb) at substantially the same level as that of a top surface of the support pattern SP. Thicknesses DSPa_T of the plurality of first segments DSPa of the dummy support pattern DSP, a thickness DSPb_T of the second segment DSPb of the dummy support pattern DSP, and a thickness SP_T of the support pattern SP may be substantially the same as each other.

The buried insulation pattern BIP may be provided between the dummy support pattern DSP and the lower insulation layer 110. The buried insulation pattern BIP may fill the plurality of recess regions RR. The buried insulation pattern BIP may extend between the dummy support pattern DSP and the pad insulation layer 120 (or the dummy pads DP). The buried insulation pattern BIP may have a sidewall that is laterally recessed from a sidewall of the dummy support pattern DSP. In this configuration, the undercut UC may be defined underneath the dummy support pattern DSP. The buried insulation pattern BIP may include a material having an etch selectivity to the dummy support pattern DSP and the support pattern SP. For example, the buried insulation pattern BIP may include silicon oxide.

The first upper insulation layer 140 on the TSV region TR may cover the dummy support pattern DSP and the buried insulation pattern BIP. The first upper insulation layer 140 may fill the undercut UC underneath the dummy support pattern DSP. The first upper insulation layer 140 may be substantially the same as that discussed with reference to FIGS. 2 and 3.

A plurality of TSV electrodes 150 may be provided on the TSV region TR. Each of the plurality of TSV electrodes 150 may penetrate the substrate 100, the lower insulation layer 110, the etch stop layer 130, the buried insulation pattern BIP, the dummy support pattern DSP, and the first upper insulation layer 140. For example, the plurality of TSV electrodes 150 may pass through corresponding plurality of recess regions RR and through corresponding plurality of first segments DSPa of the dummy support pattern DSP. Each of the plurality of TSV electrodes 150 may be substantially the same as that discussed with reference to FIGS. 2 and 3, except that the plurality of TSV electrodes 150 pass through one dummy support pattern DSP.

Figure 9A:
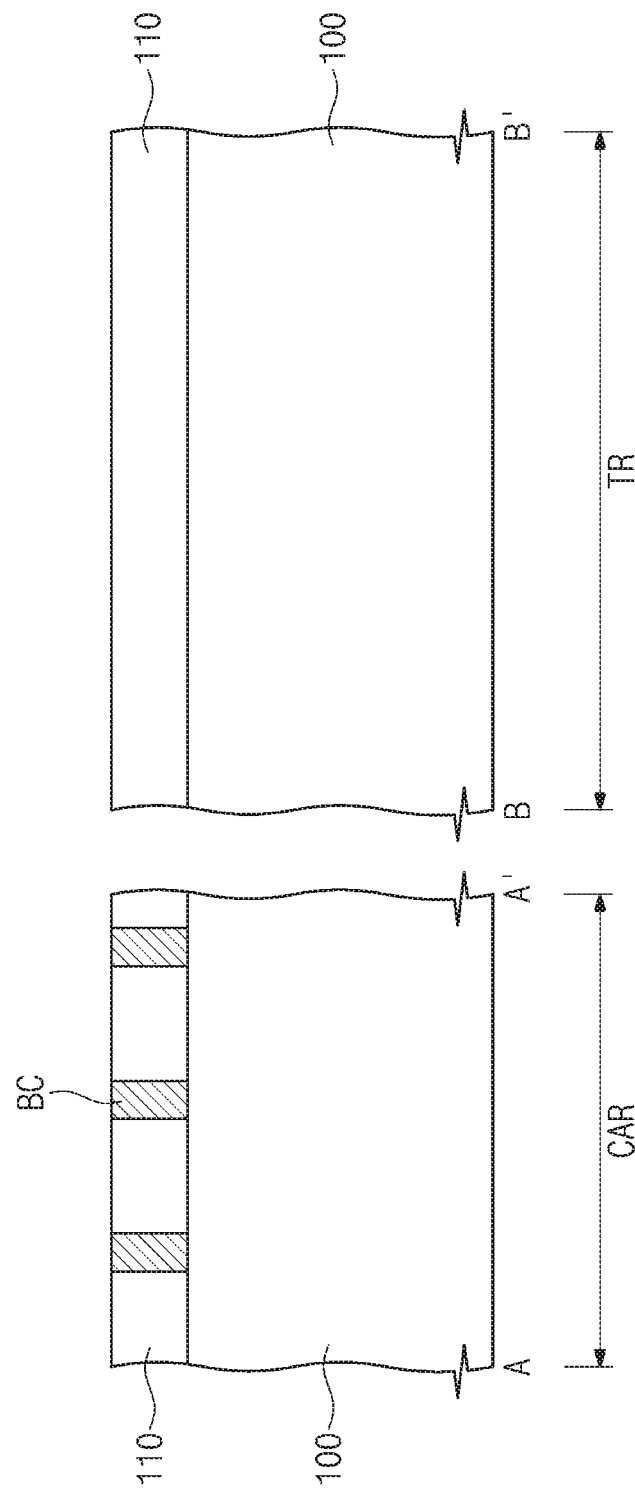
FIGS. 9A to 9N illustrate cross-sectional views showing a method of manufacturing a semiconductor device according to some example embodiments of the inventive concepts.
Figure 9B:
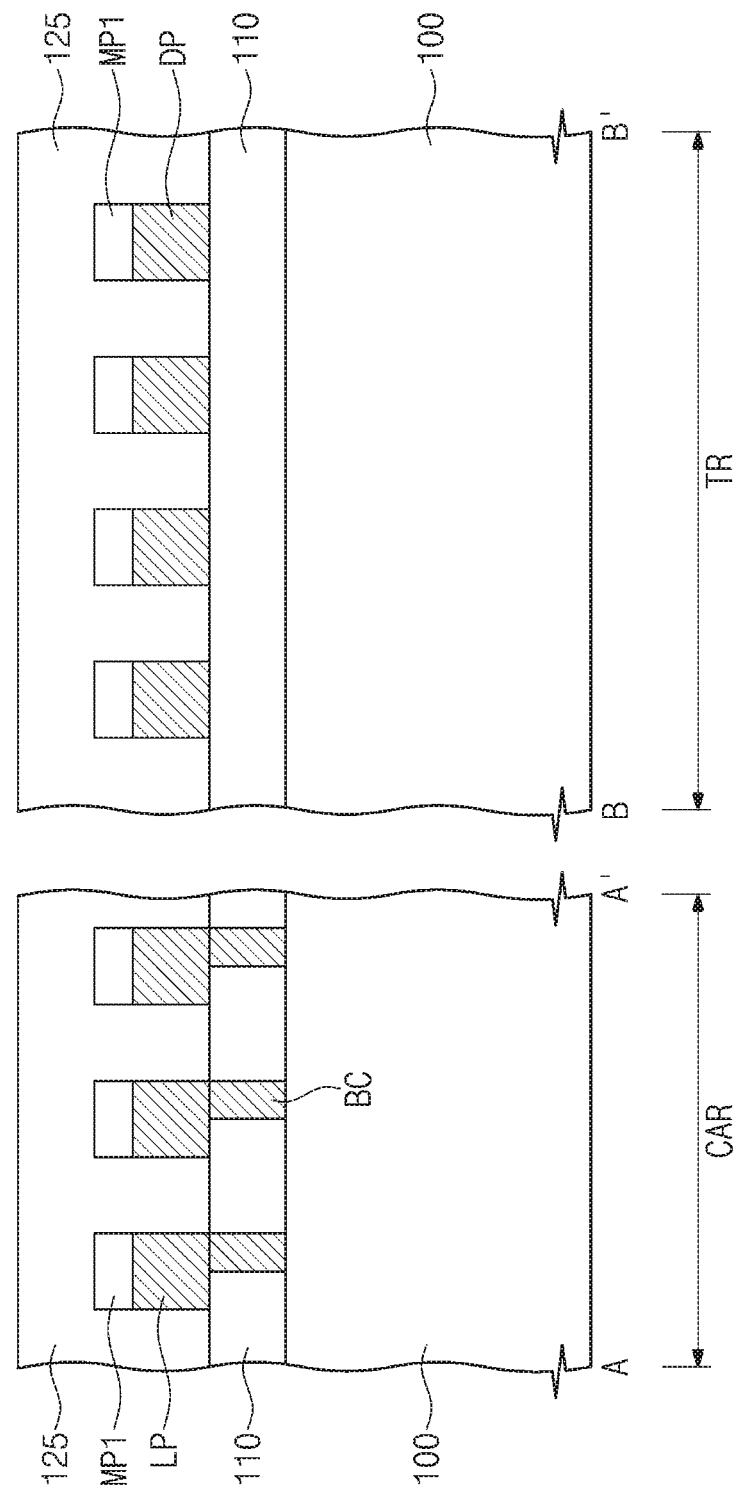
Figure 9D:
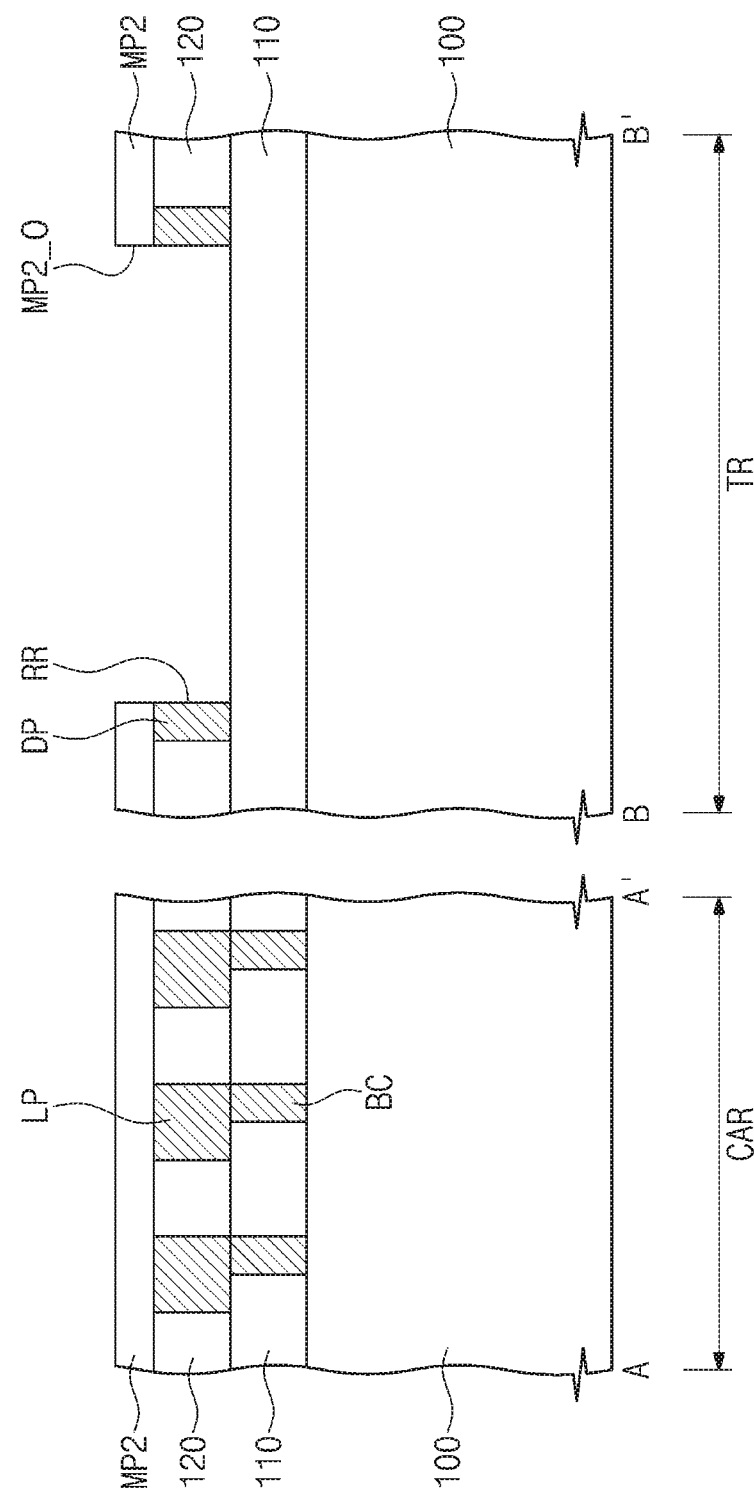
Figure 9E:
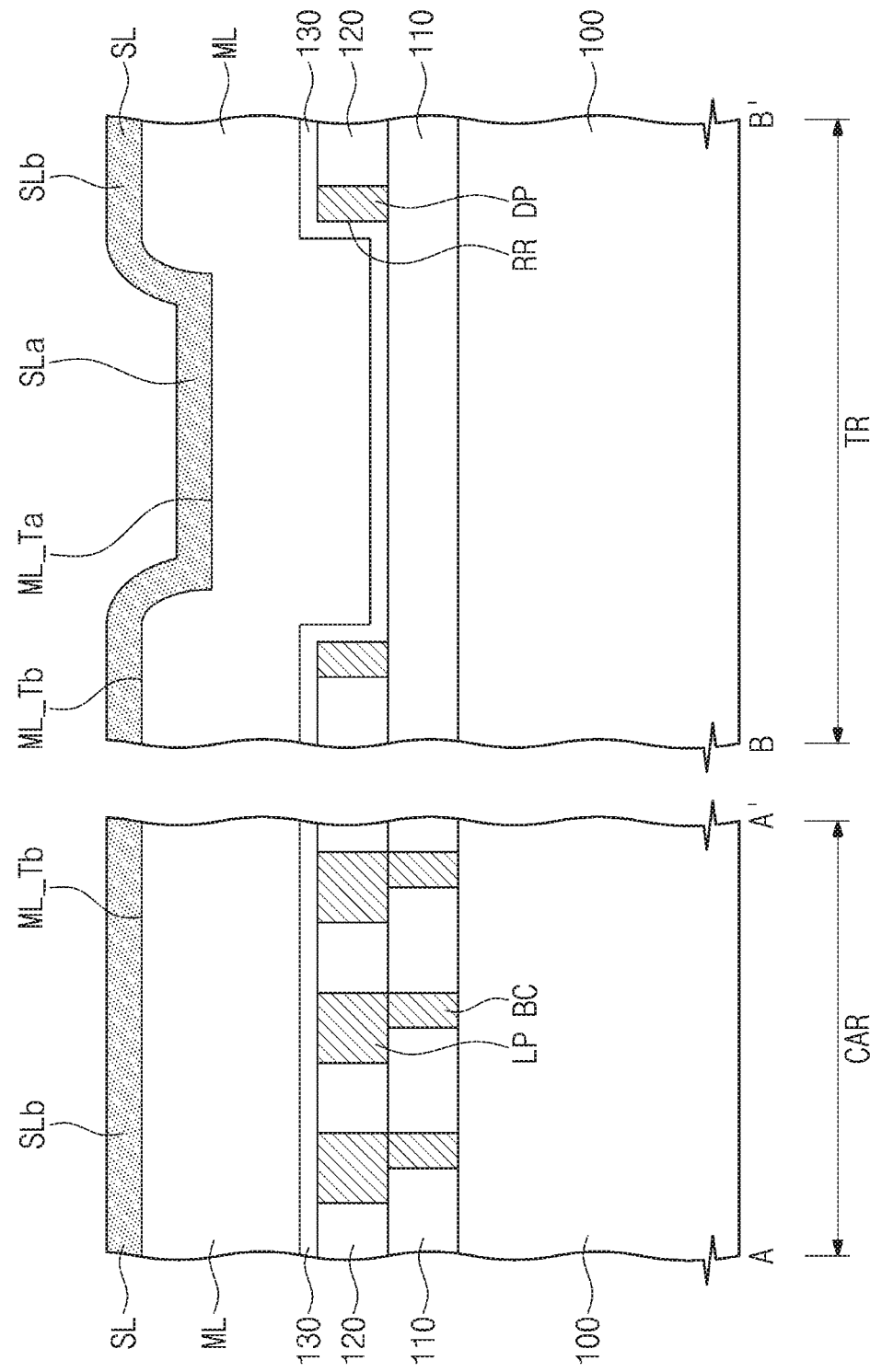
Figure 9F:
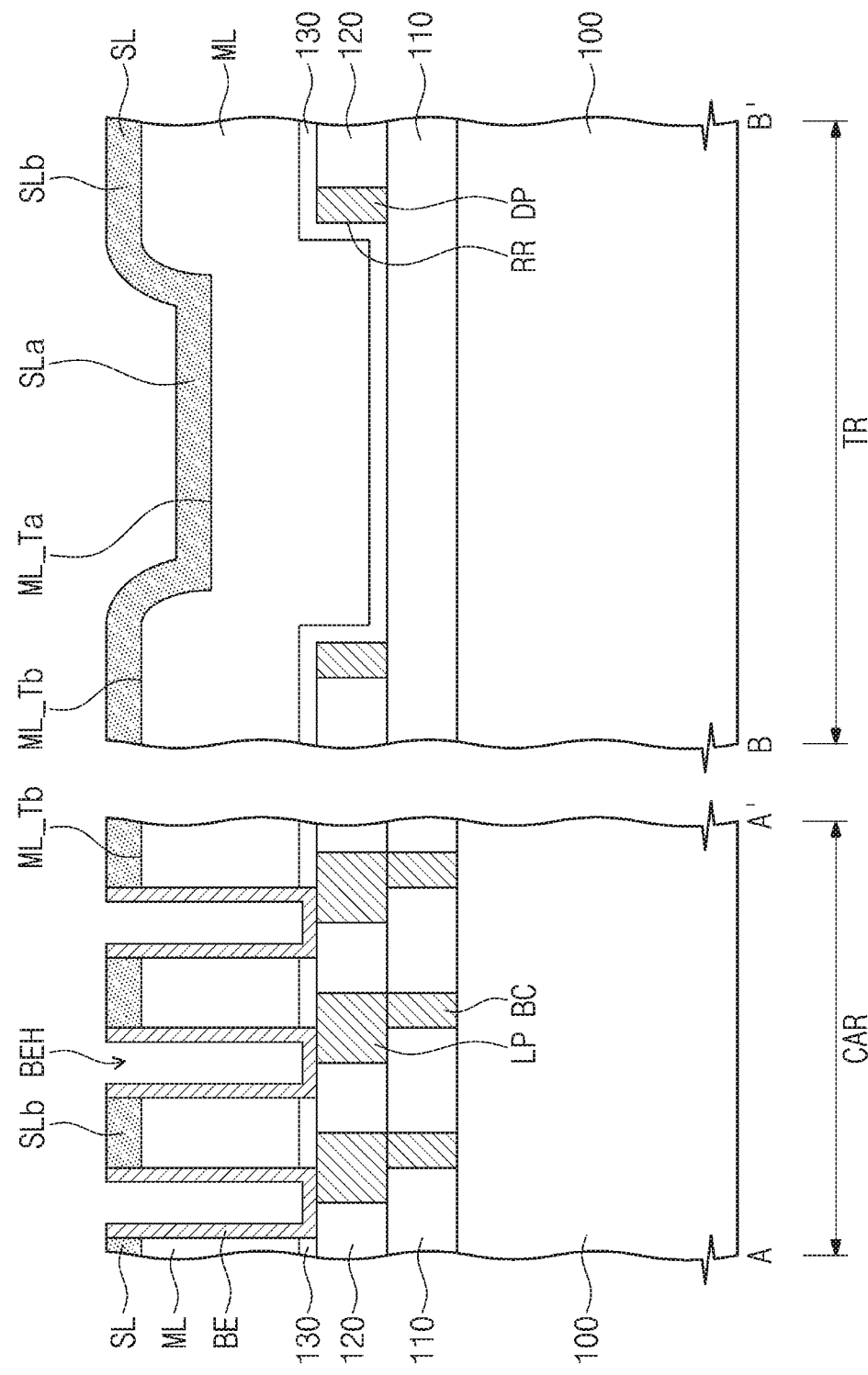
Figure 9G:
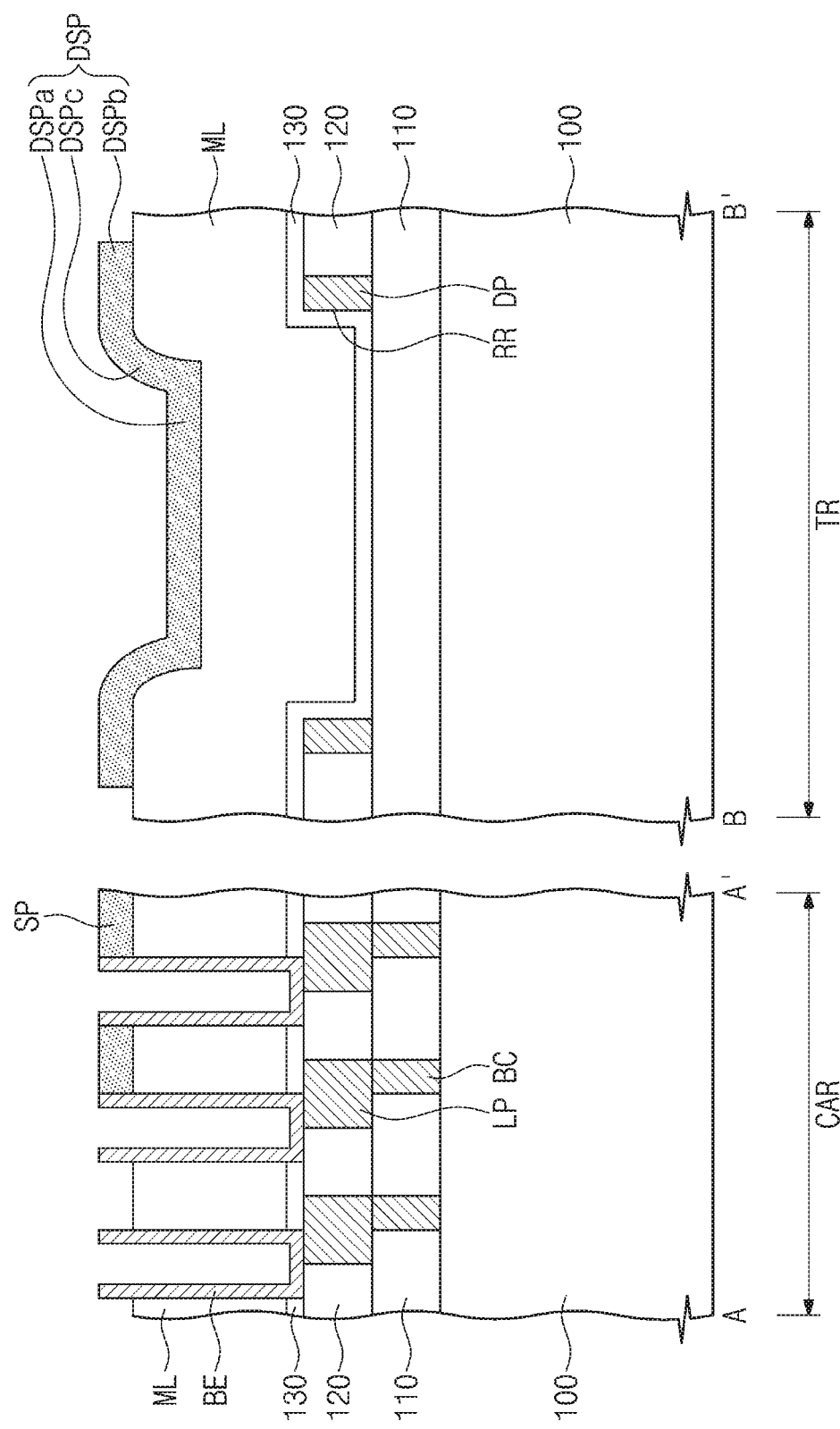
Figure 9H:
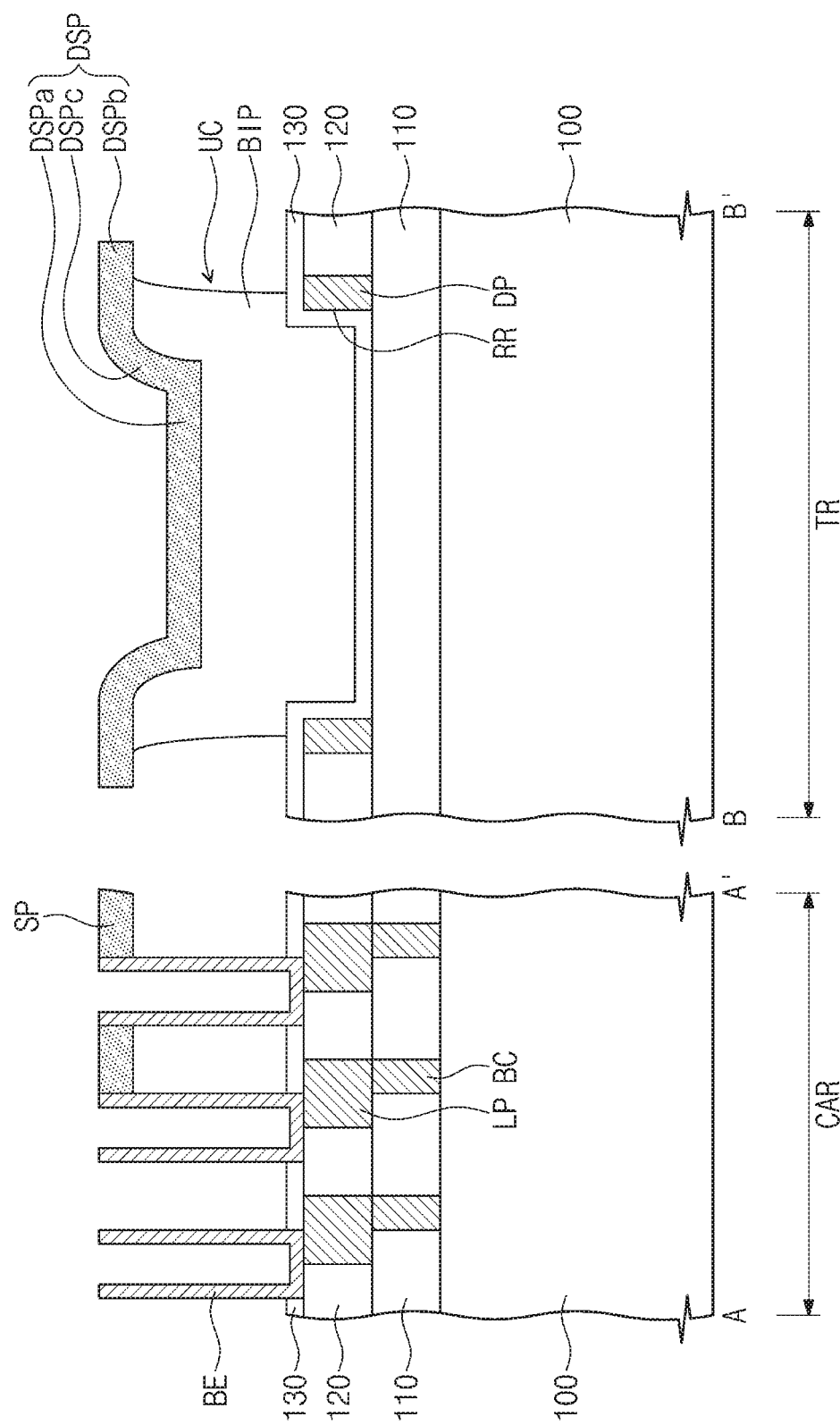
Figure 9I:
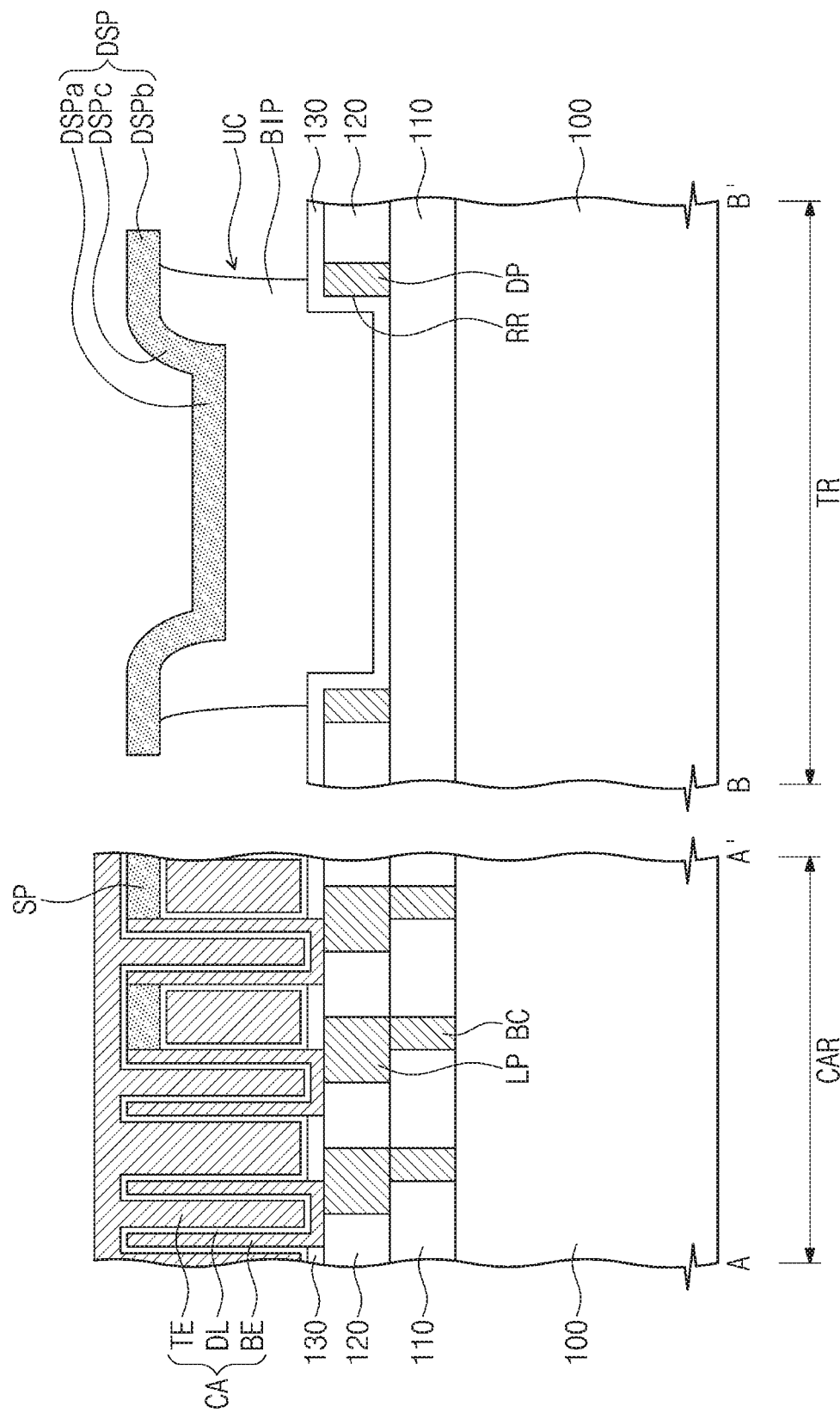
Figure 9J:
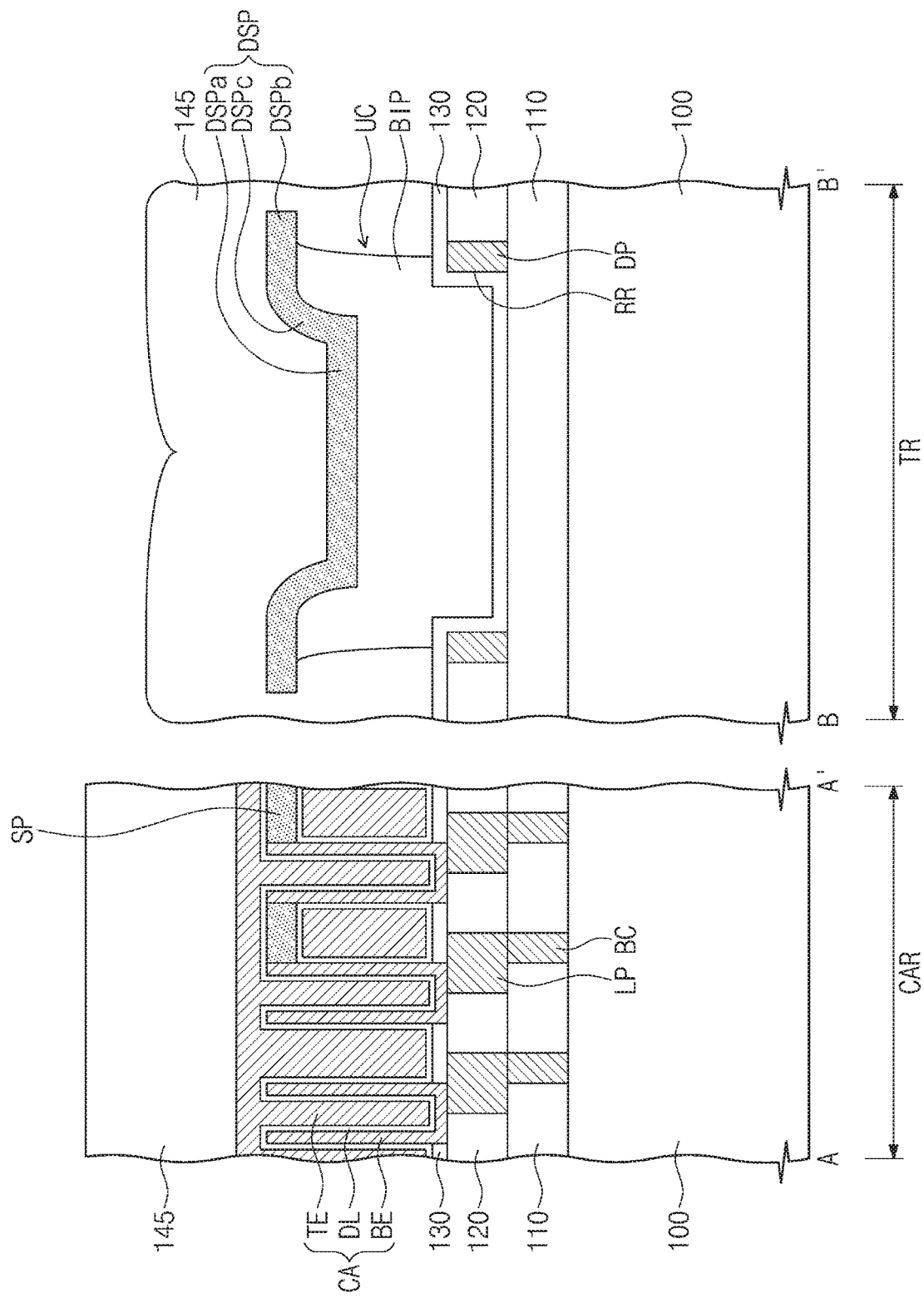
Figure 9K:
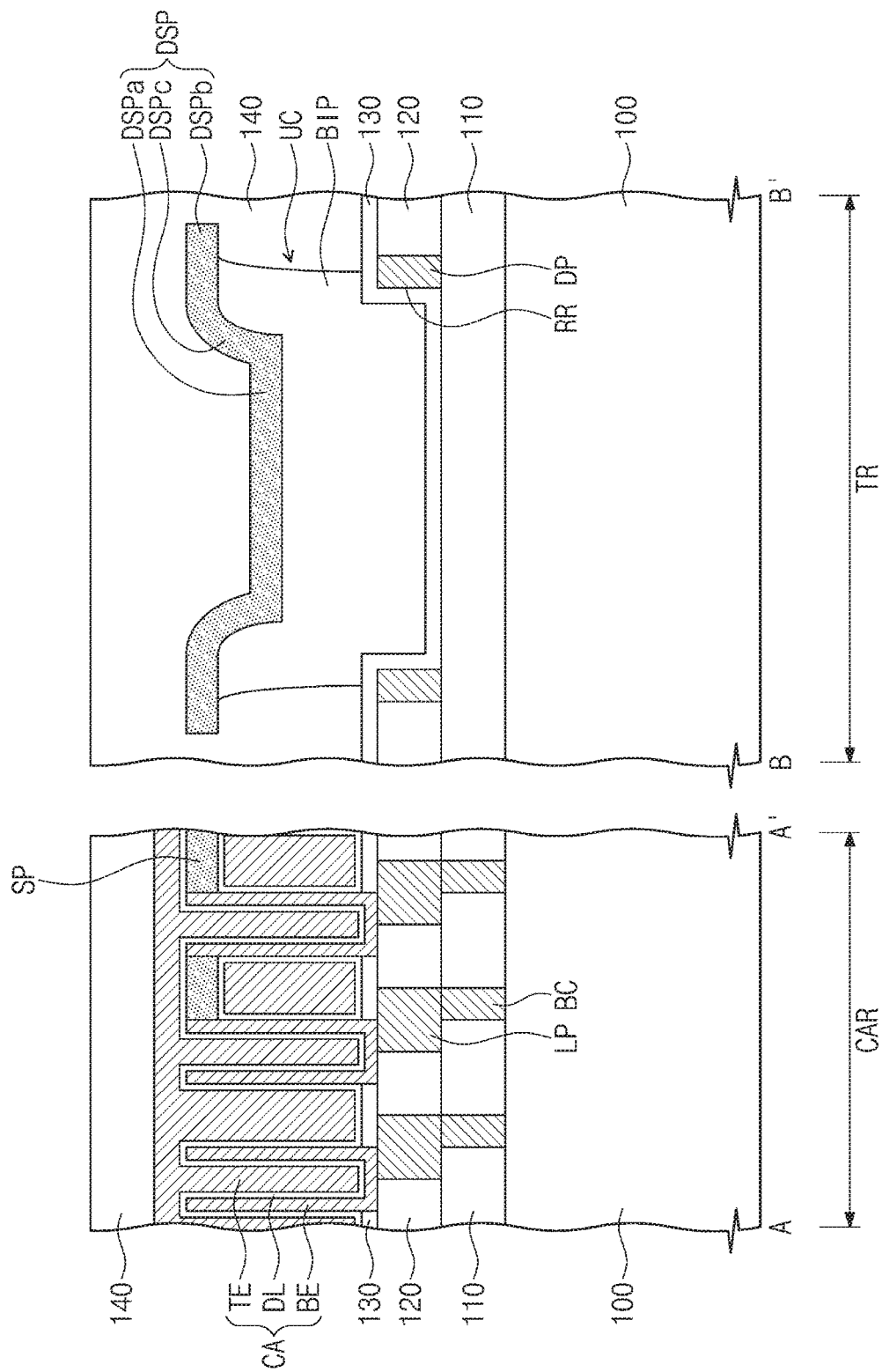
Figure 9M:
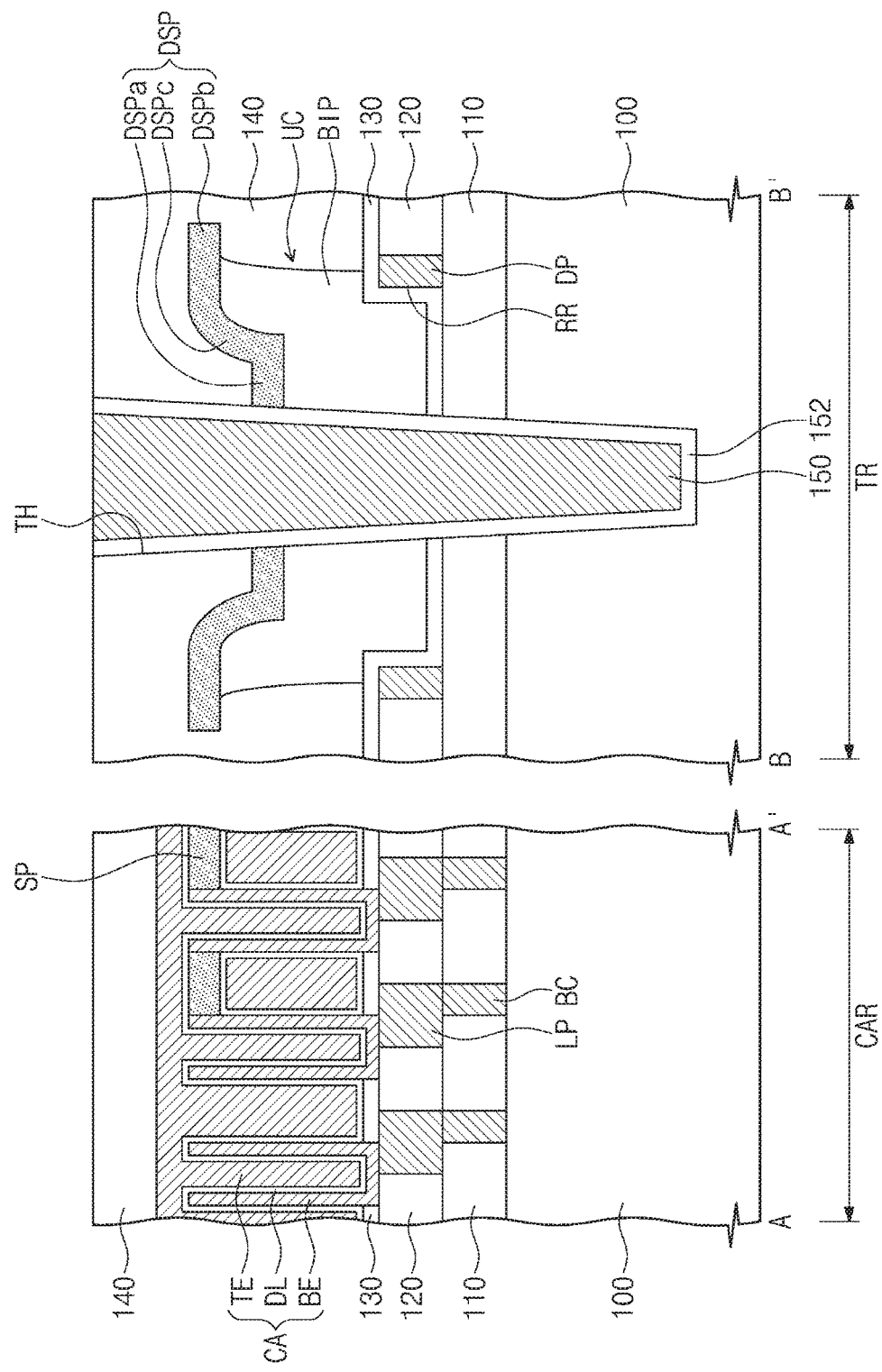
Figure 9N:
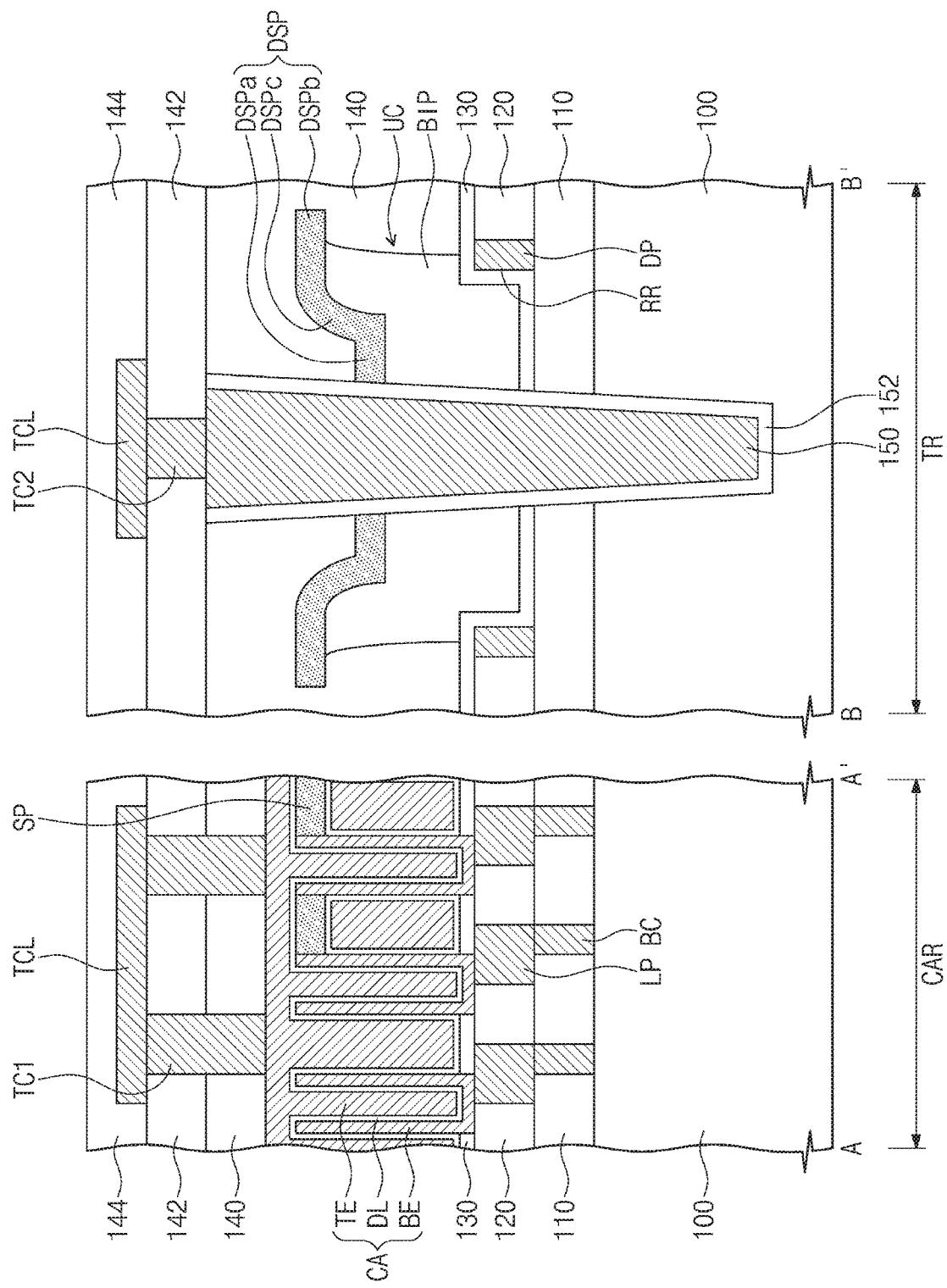

FIGS. 9A to 9N illustrate cross-sectional views showing a method of manufacturing a semiconductor device according to some example embodiments of the inventive concepts. For example, FIGS. 9A to 9N are cross-sectional views taken along lines A-A' and B-B' of FIG. 2. In the example embodiments that follow, components substantially the same as those discussed with reference to FIGS. 2 and 3 are allocated the same reference numerals thereto, and a repetitive explanation thereof will be omitted for brevity of description.

Referring to FIGS. 2 and 9A, a substrate 100 may be provided. The substrate 100 may include a cell array region CAR and a TSV region TR.

Transistors (not shown) may be formed on the cell array region CAR of the substrate 100. Some components (e.g., source and drain regions) of the transistors may be formed in the substrate 100. No transistors may be formed on the TSV region TR of the substrate 100.

A lower insulation layer 110 may be formed on the substrate 100. The lower insulation layer 110 may cover the transistors on the cell array region CAR. For example, the lower insulation layer 110 may be formed by chemical vapor deposition, physical vapor deposition, and/or atomic layer deposition.

Bottom contacts BC may be formed in the lower insulation layer 110. The bottom contacts BC may be coupled to terminals of the transistors. For example, the bottom contact BC may be formed by chemical vapor deposition, physical vapor deposition, and/or atomic layer deposition.

Referring to FIGS. 2 and 9B, landing pads LP may be formed on the lower insulation layer 110 of the cell array region CAR, and dummy pads DP may be formed on the lower insulation layer 110 of the TSV region TR. The landing pads LP and the dummy pads DP may be formed at the same time. For example, the formation of the landing pads LP and the dummy pads DP may include forming a conductive layer (not shown) on the lower insulation layer 110, forming first mask patterns MP1 on the conductive layer, and using the first mask patterns MP1 as an etch mask to pattern the conductive layer. The landing pads LP may be spaced apart from each other and may be two-dimensionally arranged. The dummy pads DP may be spaced apart from each other and may be two-dimensionally arranged.

A preliminary pad insulation layer 125 may be formed on the lower insulation layer 110 to thereby cover the landing pads LP and the dummy pads DP. For example, the preliminary pad insulation layer 125 may be formed by chemical vapor deposition, physical vapor deposition, and/or atomic layer deposition.

Referring to FIGS. 2 and 9C, a pad insulation layer 120 may be formed to fill between the landing pads LP and the dummy pads DP. The formation of the pad insulation layer 120 may include performing a planarization process on the preliminary pad insulation layer 125 until top surfaces of the landing pads LP are exposed. The planarization process may be performed by chemical mechanical planarization. The planarization process may remove the first mask patterns MP1.

When the dummy pads DP are not provided on the TSV region TR, the planarization process may excessively remove the preliminary pad insulation layer 125 on the TSV region TR. Accordingly, a dishing phenomenon may occur, in which a central portion of the pad insulation layer 120 on the TSV region TR is concavely recessed. The dishing phenomenon may be attributed to the fact that a pattern density in the preliminary pad insulation layer 125 may be much less on the TSV region TR than on the cell array region CAR.

The dummy pads DP may increase the pattern density in the preliminary pad insulation layer 125 on the TSV region TR. For example, the dummy pads DP may be formed such that the pattern density in the preliminary pad insulation layer 125 on the TSV region TR becomes similar to the pattern density in the preliminary pad insulation layer 125 on the cell array region CAR. Therefore, when the planarization process is performed, the dummy pads DP may suppress the dishing phenomenon on the central portion of the pad insulation layer 120 on the TSV region TR.

Referring to FIGS. 2 and 9D, a recess region RR may be formed in the pad insulation layer 120 on the TSV region TR. The formation of the recess region RR may include forming, on the pad insulation layer 120, a second mask pattern MP2 having an opening MP2_O through which the dummy pads DP are partially exposed and performing an etching process in which the second mask pattern MP2 is used as an etch mask. The etching process may remove the exposed portions of the dummy pads DP through the opening MP2_O and the exposed portion of the pad insulation layer 120 through the opening MP2_O. After the recess region RR is formed, the second mask pattern MP2 may be removed.

Referring to FIGS. 2 and 9E, an etch stop layer 130, a mold layer ML, and a support layer SL may be sequentially formed on the pad insulation layer 120. For example, each of the etch stop layer 130, the mold layer ML, and the support layer SL may be formed by chemical vapor deposition, physical vapor deposition, and/or atomic layer deposition.

The etch stop layer 130 may cover a top surface of the pad insulation layer 120, top surfaces of the landing pads LP, and top surfaces of the dummy pads DP. The etch stop layer 130 may conformally cover an inner sidewall and a floor surface of the recess region RR. For example, the etch stop layer 130 may include silicon nitride.

The mold layer ML may be formed on the etch stop layer 130. The mold layer ML may fill the recess region RR. The mold layer ML may include a first top surface ML_Ta vertically overlapping the recess region RR and a second top surface ML_Tb not vertically overlapping the recess region RR. The first top surface ML_Ta of the mold layer ML may be positioned lower than the second top surface ML_Tb of the mold layer ML. The mold layer ML may include a material having an etch selectivity to the etch stop layers 130. For example, the mold layer ML may include silicon oxide.

The support layer SL may be conformally formed on the top surface of the mold layer ML. The support layer SL may include a first segment SLa on the first top surface ML_Ta of the mold layer ML and a second segment SLb on the second surface ML_Tb of the mold layer ML. The first segment SLa of the support layer SL may be positioned lower than the second segment SLb of the support layer SL. The support layer SL may include a material having an etch selectivity to the mold layer ML. For example, the support layer SL may include silicon nitride and/or silicon carbon nitride.

Referring to FIGS. 2 and 9F, on the cell array region CAR, bottom electrode holes BEH may be formed in the support layer SL and the mold layer ML. Each of the bottom electrode holes BEH may penetrate the support layer SL, the mold layer ML, and the etch stop layer 130. The bottom electrode holes BEH may expose corresponding landing pads LP.

Bottom electrodes BE may be formed in corresponding bottom electrode holes BEH. For example, each of the bottom electrodes BE may conformally cover an inner sidewall of a corresponding bottom electrode BEH. The bottom electrodes BE may be in contact with corresponding landing pads LP. The formation of the bottom electrodes BE may include performing an atomic layer deposition process.

Referring to FIGS. 2 and 9G, the support layer SL may be patterned to form a support pattern SP on the cell array region CAR and a dummy support pattern DSP on the TSV region TR.

The support pattern SP may be formed by patterning the second segment SLb of the support layer SL on the cell array region CAR. The support pattern SP may include openings SP_O. The openings SP_O may expose the mold layer ML on the cell array region CAR.

When viewed in plan, the dummy support pattern DSP may overlap the recess region RR. The dummy support pattern DSP may include a first segment DSPa at its center, a second segment DSPb around the first segment DSPa, and a third segment DPSc that lies between and connects the first and second segments DSPa and DSPb. The first segment DSPa of the dummy support pattern DSP may be formed from the first segment SLa of the support layer SL on the TSV region TR. The second segment DSPb of the dummy support pattern DSP may be formed from the second segment SLb of the support layer SL on the TSV region TR. The mold layer ML on the TSV region TR may be exposed around the dummy support pattern DSP.

Referring to FIGS. 2 and 9H, the mold layer ML on the cell array region CAR may be removed. The removal of the mold layer ML on the cell array region CAR may be achieved using a wet etching process that exhibits an etch selectivity to the etch stop layer 130, the bottom electrodes BE, and the support pattern SP. The removal of the mold layer ML on the cell array region CAR may expose a surface of the bottom electrode BE and a top surface of the etch stop layer 130 on the cell array region CAR.

A buried insulation pattern BIP may be formed from the mold layer ML on the TSV region TR. The buried insulation pattern BIP may be formed between the dummy support pattern DSP and the lower insulation layer 110, thereby filling the recess region RR. The formation of the buried insulation pattern BIP may be achieved using a wet etching process that exhibits an etch selectivity to the etch stop layer 130, the bottom electrodes BE, and the dummy support pattern DSP. The mold layer ML underneath the dummy support pattern DSP may be partially etched during the wet etching process. Thus, the buried insulation pattern BIP may have a sidewall that is laterally recessed from a sidewall of the dummy support pattern DSP, and an undercut UC may be formed underneath the second segment DSPb of the dummy support pattern DSP.

The removal of the mold layer ML on the cell array region CAR may be executed simultaneously with the formation of the buried insulation pattern BIP on the TSV region TR. For example, when the mold layer ML on the cell array region CAR is removed, the mold layer ML on the TSV region TR may be partially etched to form the buried insulation pattern BIP.

Referring to FIGS. 2 and 9I, a dielectric layer DL may be formed to conformally cover the exposed surfaces of the bottom electrodes BE. The dielectric layer DL may extend onto a top surface of the etch stop layer 130 and onto a surface of the support pattern SP. For example, the dielectric layer DL may be formed by atomic layer deposition.

A top electrode TE may be formed to cover the dielectric layer DL on the cell array region CAR. The formation of the top electrode TE may include forming a conductive layer (not shown) to cover the dielectric layer DL and removing a portion of the conductive layer from the TSV region TR. The bottom electrodes BE, the dielectric layer DL, and the top electrode TE may constitute a plurality of capacitors CA.

Referring to FIGS. 2 and 9J, a preliminary first upper insulation layer 145 may be formed to cover the top electrode TE, the dummy support pattern DSP, and the buried insulation pattern BIP. The preliminary first upper insulation layer 145 may fill the undercut UC. For example, the preliminary first upper insulation layer 145 may be formed by chemical vapor deposition or atomic layer deposition. For example, the preliminary first upper insulation layer 145 may include silicon oxide, silicon nitride, and/or silicon oxynitride.

As discussed above, the capacitors CA may be formed on the cell array region CAR, but not on the TSV region TR. Accordingly, when the preliminary first upper insulation layer 145 is formed, a step difference may be generated between a structure on the cell array region CAR and a structure on the TSV region TR. The preliminary first upper insulation layer 145 may be formed to fill or remove the step difference. In this sense, it may be required that the preliminary first upper insulation layer 145 be formed thicker as the step difference becomes greater.

As discussed above, the buried insulation pattern BIP formed underneath the dummy support pattern DSP may fill the recess region RR on the TSV region TR. Therefore, the buried insulation pattern BIP and the dummy support pattern DSP may alleviate the step difference between the cell array region CAR and the TSV region TR. As a result, due to the buried insulation pattern BIP and the dummy support pattern DSP, the preliminary first upper insulation layer 145 may be formed to have a relatively small thickness, compared to the case that none of the buried insulation pattern BIP and the dummy support pattern DSP is formed.

Referring to FIGS. 2 and 9K, a planarization process may be performed on the preliminary first upper insulation layer 145 to form a first upper insulation layer 140. The planarization process may be executed by chemical mechanical planarization.

A reduction in thickness of the preliminary first upper insulation layer 145 may cause a decrease in removal amount of the preliminary first upper insulation layer 145 in the planarization process, resulting in bringing down a distribution of the planarization process. As discussed above, since the preliminary first upper insulation layer 145 is formed relatively thinner due to the buried insulation pattern BIP and the dummy support pattern DSP, the distribution of the planarization process may be brought down and the first upper insulation layer 140 may be formed uniformly (e.g., to have a flat top surface).

Referring to FIGS. 2 and 9L, a TSV hole TH may be formed on the TSV region TR. On the TSV region TR, the TSV hole TH may be formed to penetrate the first upper insulation layer 140, the dummy support pattern DSP, the buried insulation pattern BIP, the etch stop layer 130, and the lower insulation layer 110 to thereby extend into the substrate 100. For example, the TSV hole TH may be formed to penetrate the first segment DSPa of the dummy support pattern DSP. The formation of the TSV hole TH may include forming on the first upper insulation layer 140 a third mask pattern MP3 having an opening MP3_O and using the third mask pattern MP3 as an etch mask to sequentially etch the first upper insulation layer 140, the dummy support pattern DSP, the buried insulation pattern BIP, the etch stop layer 130, the lower insulation layer 110, and the substrate 100.

The TSV hole TH may be formed to pass through the recess region RR. As discussed above, since the recess region RR is formed when the dummy pads DP are removed, the dummy pads DP may not be etched during the formation of the TSV hole TH. The dummy pads DP may include a hardly etchable material (e.g., metal). According to some example embodiments of the inventive concepts, the dummy pads DP may not be etched when the TSV hole TH is formed, such that the TSV hole TH may be easily formed.

Referring to FIGS. 2 and 9M, a through insulation pattern 152 and a TSV electrode 150 may be formed in the TSV hole TH. The through insulation pattern 152 may be formed to conformally cover an inner surface of the TSV hole TH, and the TSV electrode 150 may be formed to fill the TSV hole TH.

The formation of the through insulation pattern 152 and the TSV electrode 150 may include forming an insulation layer (not shown) to conformally cover the inner surface of the TSV hole TH, forming a conductive layer (not shown) to fill the TSV hole TH, and performing a planarization process until a top surface of the first upper insulation layer 140 is exposed. The planarization process may remove the third mask patterns MP3.

Referring back to FIGS. 2 and 9N, a second upper insulation layer 142 may be formed on the first upper insulation layer 140. For example, the second upper insulation layer 142 may be formed by chemical vapor deposition, physical vapor deposition, and/or atomic layer deposition.

First top contacts TC1 may be formed in the first and second upper insulation layers 140 and 142 of the cell array region CAR. The first top contacts TC1 may penetrate the first and second upper insulation layers 140 and 142 to come into electrical connection with the top electrode TE.

A second top contact TC2 may be formed in the second upper insulation layer 142 of the TSV region TR. The second top contact TC2 may penetrate the second upper insulation layer 142 to come into electrical connection with the TSV electrode 150.

Top connection lines TCL may be formed on the second upper insulation layer 142. The top connection lines TCL may be electrically connected to the first top contacts TC1 and the second top contact TC2.

A third upper insulation layer 144 may be formed on the second upper insulation layer 142. The third upper insulation layer 144 may be formed to cover the top connection lines TCL. For example, the third upper insulation layer 144 may be formed by chemical vapor deposition, physical vapor deposition, and/or atomic layer deposition.

Referring back to FIGS. 2 and 3, a lower portion of the substrate 100 may be removed to expose a bottom surface of the TSV electrode 150. The removal of the lower portion of the substrate 100 may include performing a planarization process on the lower portion of the substrate 100 until the bottom surface of the TSV electrode 150 is exposed.

According to some example embodiments of the inventive concepts, due to the buried insulation pattern and the dummy support pattern, the preliminary first upper insulation layer may be formed to have a relatively small thickness. Therefore, the distribution of the planarization process may be brought down, and the first upper insulation layer may be formed uniformly (e.g., to have a flat top surface) and, thus, a relatively highly reliable semiconductor device may be formed.

Although some example embodiments have been described in connection with the example embodiments of the inventive concepts illustrated in the accompanying drawings, it will be understood to those skilled in the art that various changes and modifications may be made without departing from the example embodiments of inventive concepts. It will be apparent to those skilled in the art that various substitution, modifications, and changes may be thereto without departing from the scope and spirit of the example embodiments of the inventive concepts.

What is claimed is:

1. A semiconductor device, comprising:
    a substrate including a cell array region and a through-silicon-via (TSV) region;
    an insulation layer on the substrate within the cell array region and the TSV region, the insulation layer including a recess region within the TSV region;
    a capacitor on the insulation layer within the cell array region;
    a dummy support pattern on the insulation layer within the TSV region such that the dummy support pattern overlaps the recess region, when viewed in plan view;
    a plurality of dummy pads in the insulation layer within the TSV region; and
    a TSV electrode penetrating the dummy support pattern and the substrate.

2. The semiconductor device of claim 1, wherein the TSV electrode traverses the recess region.

3. The semiconductor device of claim 1, wherein an area of the dummy support pattern is greater than an area of the recess region, when viewed in plan view.

4. The semiconductor device of claim 1, wherein the dummy support pattern comprises:
    a first segment and a second segment, the first segment of the dummy support pattern being at a center of the dummy support pattern, and the second segment of the dummy support pattern being around the first segment such that a level of the first segment of the dummy support pattern is lower than a level of the second segment of the dummy support pattern with respect to the substrate.

5. The semiconductor device of claim 4, wherein the second segment of the dummy support pattern surrounds the first segment of the dummy support pattern, when viewed in plan view.

6. The semiconductor device of claim 4, wherein
    the first segment of the dummy support pattern overlaps the recess region, when viewed in plan view, and
    at least a portion of the second segment of the dummy support pattern does not overlap the recess region, when viewed in plan view.

7. The semiconductor device of claim 4, wherein the first segment of the dummy support pattern and the second segment of the dummy support pattern have substantially a same thickness.

8. The semiconductor device of claim 4, wherein the dummy support pattern further comprises:
    a third segment connecting the first segment of the dummy support pattern and the second segment of the dummy support pattern.

9. The semiconductor device of claim 4, wherein the TSV electrode penetrates the first segment of the dummy support pattern.

10. The semiconductor device of claim 1, further comprising:
    a buried insulation pattern underneath the dummy support pattern with respect to the substrate such that the buried insulation pattern fills the recess region.

11. The semiconductor device of claim 10, wherein a sidewall of the buried insulation pattern is laterally recessed from a sidewall of the dummy support pattern.

12. The semiconductor device of claim 1, wherein the dummy support pattern is a first dummy support pattern, and the semiconductor device further comprises:
    a second dummy support pattern between the insulation layer and the first dummy support pattern such that the TSV electrode penetrates the second dummy support pattern.

13. The semiconductor device of claim 12, wherein the second dummy support pattern comprises:
    a first segment and a second segment, the first segment of the second dummy support pattern being at a center of the second dummy support pattern, and the second segment of the second dummy support pattern being around the first segment of the second dummy support pattern such that a level of the first segment of the second dummy support pattern is lower than a level of the second segment of the second dummy support pattern with respect to the substrate.

14. The semiconductor device of claim 13, wherein
    the first segment of the second dummy support pattern overlaps the recess region, when viewed in plan view, and
    at least a portion of the second segment of the second dummy support pattern does not overlap the recess region, when viewed in plan view.

15. The semiconductor device of claim 1, further comprising:
    a plurality of landing pads in the insulation layer within the cell array region, at least one of the plurality of landing pads being connected to the capacitor.

16. The semiconductor device of claim 15, wherein the plurality of dummy pads are not in the insulation layer within the recess region.

17. A semiconductor device, comprising:
    a substrate including a cell array region and a through-silicon-via (TSV) region;
    an insulation layer within the cell array region and the TSV region, the insulation layer including a recess region within the TSV region;
    a plurality of bottom electrodes on the insulation layer within the cell array region;
    a support pattern on sidewalls of each of the plurality of bottom electrodes;
    a dummy support pattern on the insulation layer within the TSV region such that the dummy support pattern overlaps the recess region, when viewed in plan view;
    a plurality of dummy pads in the insulation layer within the TSV region; and
    a TSV electrode penetrating the dummy support pattern and the substrate.

18. The semiconductor device of claim 17, wherein a level of a bottom surface of the dummy support pattern is lower than a level of a bottom surface of the support pattern with respect to the substrate.

19. The semiconductor device of claim 17, wherein a level of a top surface of the dummy support pattern is substantially at a same level as a level of a top surface of the support pattern with respect to the substrate.

20. A semiconductor device, comprising:
- a substrate including a cell array region and a through-silicon-via (TSV) region;
- an insulation layer on the substrate within the cell array region and the TSV region, the insulation layer including a plurality of recess regions within the TSV region;
- a capacitor on the insulation layer within the cell array region;
- a dummy support pattern on the insulation layer within the TSV region such that the dummy support pattern overlaps each of the plurality of recess regions, when viewed in plan view;
- a plurality of dummy pads in the insulation layer within the TSV region; and
- a plurality of TSV electrodes within the TSV region each penetrating the dummy support pattern and the substrate.

* * * * *